(12) United States Patent
Lesso et al.

(10) Patent No.: US 8,363,856 B2
(45) Date of Patent: Jan. 29, 2013

(54) AUDIO AMPLIFIER CIRCUIT AND ELECTRONIC APPARATUS INCLUDING THE SAME

(75) Inventors: John P. Lesso, Edinburgh (GB); John L. Pennock, Midlothian (GB); Peter J. Frith, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 1446 days.

(21) Appl. No.: 12/000,548

(22) Filed: Dec. 13, 2007

(65) Prior Publication Data

US 2008/0159567 A1 Jul. 3, 2008

(30) Foreign Application Priority Data

Dec. 22, 2006 (GB) .................................. 0625799.2

(51) Int. Cl.
*H03F 99/00* (2009.01)
(52) U.S. Cl. ........................................ 381/120; 381/122
(58) Field of Classification Search .................... 381/120
See application file for complete search history.

(56) References Cited

U.S. PATENT DOCUMENTS

| | | | |
|---|---|---|---|
| 3,772,606 A | 11/1973 | Waehner | |
| 4,054,843 A | 10/1977 | Hamada et al. | |
| 4,115,739 A | 9/1978 | Sano et al. | |
| 4,409,559 A | 10/1983 | Amada et al. | |
| 4,430,625 A | 2/1984 | Yokoyama et al. | |
| 5,075,643 A | 12/1991 | Einbinder | |
| 5,289,137 A | 2/1994 | Nodar et al. | |
| 5,442,317 A | 8/1995 | Stengel | |
| 5,459,654 A * | 10/1995 | Williams et al. | 363/98 |
| 5,532,916 A | 7/1996 | Tamagawa et al. | |
| 5,760,637 A | 6/1998 | Wong et al. | |
| 5,898,340 A | 4/1999 | Chatterjee et al. | |
| 6,084,789 A | 7/2000 | Van Lieshout | |
| 6,163,214 A * | 12/2000 | Lam | 330/251 |
| 6,166,605 A | 12/2000 | Carver | |

(Continued)

FOREIGN PATENT DOCUMENTS

| | | |
|---|---|---|
| EP | 0 585 925 | 3/1994 |
| EP | 1 569 330 | 8/2005 |

(Continued)

OTHER PUBLICATIONS

"Dual Power JFET-Input Operational Amplifier With Switched-Capacitor Voltage Converter", TLE2662, Texas Instruments, pp. 1,2, 10, 25 (1994).

(Continued)

*Primary Examiner* — Steven Loke
*Assistant Examiner* — Igwe U Anya
(74) *Attorney, Agent, or Firm* — Dickstein Shapiro LLP

(57) ABSTRACT

An electronic audio amplifier circuit, operable in two modes and a battery powered portable audio apparatus incorporating the circuit; and associated apparatuses and methods. When in the first mode the audio apparatus is designed for the direct driving of headphones or a speaker. When in the second mode the audio apparatus is designed to drive a line input of an external amplifying apparatus with a signal that having a higher voltage amplitude for a given signal content than when driving headphone or a speaker. The circuit has common output stage circuitry for use in both modes, and a dual mode power supply circuit, ideally a charge pump circuit, for supplying the output stage in the first mode with a lower supply voltage than in the second mode.

37 Claims, 21 Drawing Sheets

U.S. PATENT DOCUMENTS

| | | | |
|---|---|---|---|
| 6,310,789 B1 * | 10/2001 | Nebrigic et al. | 363/60 |
| 6,329,800 B1 | 12/2001 | May | |
| 6,373,340 B1 | 4/2002 | Shashoua et al. | |
| 6,437,230 B2 | 8/2002 | Torii et al. | |
| 6,636,103 B2 * | 10/2003 | Wurcer et al. | 327/536 |
| 6,825,726 B2 | 11/2004 | French et al. | |
| 6,828,845 B2 | 12/2004 | Pennock et al. | |
| 7,030,699 B2 | 4/2006 | Richard et al. | |
| 7,103,189 B2 | 9/2006 | Ford | |
| 7,183,857 B2 | 2/2007 | Doy et al. | |
| 7,321,267 B2 * | 1/2008 | Salonen et al. | 331/11 |
| 7,554,408 B2 * | 6/2009 | Chen et al. | 330/297 |
| 7,714,660 B2 * | 5/2010 | Lesso et al. | 330/297 |
| 7,719,343 B2 * | 5/2010 | Burgener et al. | 327/536 |
| 7,724,161 B1 * | 5/2010 | Cyrusian | 341/53 |
| 7,733,178 B1 * | 6/2010 | Delano et al. | 330/251 |
| 8,264,273 B2 * | 9/2012 | Macfarlane | 327/536 |
| 2004/0246050 A1 | 12/2004 | Kikuchi | |
| 2005/0110574 A1 * | 5/2005 | Richard et al. | 330/297 |
| 2005/0218998 A1 * | 10/2005 | Lim | 331/16 |
| 2005/0285682 A1 | 12/2005 | Lee et al. | |
| 2006/0066409 A1 * | 3/2006 | Doy | 330/297 |
| 2007/0040827 A1 * | 2/2007 | Toyozawa et al. | 345/211 |
| 2007/0229169 A1 * | 10/2007 | Doy et al. | 330/297 |
| 2007/0285951 A1 * | 12/2007 | Bien | 363/16 |
| 2008/0019546 A1 * | 1/2008 | Delano et al. | 381/300 |
| 2008/0036542 A1 * | 2/2008 | Chen et al. | 330/297 |
| 2008/0044041 A1 * | 2/2008 | Tucker et al. | 381/120 |
| 2008/0116979 A1 | 5/2008 | Lesso et al. | |
| 2008/0144861 A1 * | 6/2008 | Melanson et al. | 381/120 |
| 2008/0150619 A1 * | 6/2008 | Lesso et al. | 327/536 |
| 2008/0150620 A1 | 6/2008 | Lesso | |
| 2008/0150621 A1 | 6/2008 | Lesso et al. | |
| 2008/0157855 A1 * | 7/2008 | Delano et al. | 327/536 |
| 2008/0288605 A1 * | 11/2008 | Major et al. | 709/207 |
| 2009/0054023 A1 * | 2/2009 | Bean et al. | 455/205 |

FOREIGN PATENT DOCUMENTS

| | | |
|---|---|---|
| GB | 2 418 792 | 4/2006 |
| GB | 2 423 429 A | 8/2006 |
| JP | 7-240636 | 9/1995 |
| JP | 8-191224 | 7/1996 |
| JP | 2001-185960 | 7/2001 |
| JP | 2002-198750 | 7/2002 |
| JP | 2005-260581 | 9/2005 |
| WO | WO 01/78248 | 10/2001 |
| WO | WO 03/096520 | 11/2003 |
| WO | WO 2004/019485 | 3/2004 |
| WO | WO 2005/101627 | 10/2005 |
| WO | WO 2006/031304 | 3/2006 |

OTHER PUBLICATIONS

Linear Technologies LTC 1983-3/LTC 1983-5 "100mA Regulated Charge-Pump Inverters in ThinSOT" Technical Description, pp. 1-12.

Dallas Semiconductor MAXIM Application Note 656 "Design Trade Offs for Single-Supply Op Amps."

* cited by examiner

AUDIO AMPLIFIER CIRCUIT AND ELECTRONIC APPARATUS INCLUDING THE SAME

The invention relates to audio amplifier circuits and electronic apparatus including such circuits. The invention has particular application in portable and battery powered audio apparatus having outputs for headphone or speaker and line level signals.

Today portable electronic audio apparatus such as MP3 players, radios and telephones with such functions built in are very popular. Generally they are usable in two modes, one mode when driving directly headphone or miniature loudspeakers and another mode when docked or connected by wire to drive the a 'line' input of higher power amplifying apparatus. In order for such devices to be miniaturised and exhibit high quality output at reasonable cost, the headphone driving is preferably done from a dual or split rail supply, generated on board the driver chip. This avoids the need for large DC blocking capacitors.

Dual rail supplies can be generated quite readily on board the amplifier chip by use of inverting charge pumps and/or DC-DC converters. Charge pumps are particularly advantageous because the size and cost of capacitors used is much less than that of the inductors and capacitors used in other types of DC-DC converter. However, the span of a dual rail supply generated by known charge pumps is generally twice the input voltage, meaning that the supply voltage to the output stage is generally much greater than the voltage amplitude of the output signal required to drive the low-impedance headphone or speaker. Particularly when using a high-fidelity linear output stage, the 'headroom' between the output level and the supply voltage translates directly into heat dissipation and wastage of battery power within the output stage.

When driving a line input, a higher load impedance is found, and optimum quality demands a relatively high voltage level in the output audio signal. As a result of these competing requirements, premium products in this market have adopted the practice of providing separate output stages, one used for line out situations via the docking connector and the other used for driving the headphone or similar load.

The invention provides a battery powered portable audio apparatus including an electronic audio amplifier circuit operable in two modes:
- a first mode for the direct driving of an audio output transducer and
- a second mode to drive a line input of an external amplifying apparatus, an output signal to be provided to the line input in the second mode having a higher voltage amplitude for a given signal content than an output signal driving the audio output transducer;
- wherein the circuit comprises common output stage circuitry for use in both modes, and a dual mode power supply circuit for supplying the output stage in the first mode with a lower supply voltage than in the second mode.

The amplifier circuit or electronic apparatus within which it is used may have a common output terminal for connection to the different loads. Alternatively or in addition, a dedicated output terminal may be provided for line level signals, as in the case of a docking terminal.

In a preferred embodiment, the dual mode power supply circuitry includes a dual mode charge pump operable in (at least) the first mode to divide an input supply voltage to provide a dual polarity supply to the output stage, the dual polarity supply spanning in total only the same or less than the input supply voltage, and in the second mode to provide a dual polarity supply to the output stage which spans greater than (for example twice) the input supply voltage.

The circuit may include means for limiting current at the signal output when operating in the second mode, so as to avoid over-driving any low impedance load (such as headphones) connected when a line input is expected.

The controller may be adapted to detect automatically the type of load connected and to select the first or second mode of operation automatically.

The detection may be made implicitly by reference to a volume setting input of the amplifier, for example when the first mode being selected when the volume is at a maximum.

The invention further provides audio apparatus including an amplifier circuit according to the invention as set forth above.

The audio apparatus may be in portable form.

The invention further provides communications apparatus (such as a portable phone) incorporating audio apparatus as set forth above.

The invention further provides headphone driving apparatus incorporating audio apparatus according to the preceding paragraphs, and a headphone jack connected to the output stage at least in the first mode. The headphone apparatus may include a separate output connector for outputting line level signals in the second mode.

The amplifier circuit may be operable to drive line level signals through the headphone jack in the second mode.

The invention further provides for a method of, on occasion, direct driving an audio output transducer having a relatively low impedance with signals in a first range of voltages, while, on separate occasions, driving a higher impedance line input of an external amplifying apparatus with signals in a higher range of amplitudes for a given signal content, using common output stage circuitry, the method comprising using a dual mode power supply to supply the common output stage circuitry in first and second modes, such that a lower supply voltage is supplied in the first mode, when the audio output transducer is being driven, than in the second mode when the higher impedance line input of an external amplifying apparatus is being driven.

The invention further provides for an electronic audio amplifier circuit operable in two modes:
- a first mode for the direct driving of an audio output transducer and
- a second mode to drive a line input of an external amplifying apparatus, an output signal to be provided to the line input in the second mode having a higher voltage amplitude for a given signal content than an output signal driving the audio output transducer;
- wherein the circuit comprises:
- common output stage circuitry for use in both modes, and a dual mode power supply circuit for supplying the output stage in the first mode with a lower supply voltage than in the second mode; and
- means for limiting the circuit's output current when operating in the second mode, such that maximum power output in the second mode is less than that in the first mode, in spite of the higher maximum voltage amplitude.

These and other features of the audio apparatus or the amplifier circuit, charge pump circuits and their applications in different electronic apparatus will be understood from a consideration of the detailed description of embodiments which follows. Other features are as described in the appended claims.

BRIEF DESCRIPTION OF THE DRAWINGS

Embodiments of the invention will now be described, by way of example only, by reference to the accompanying drawings, in which.

DETAILED DESCRIPTION OF THE EMBODIMENTS

Figure 1A:
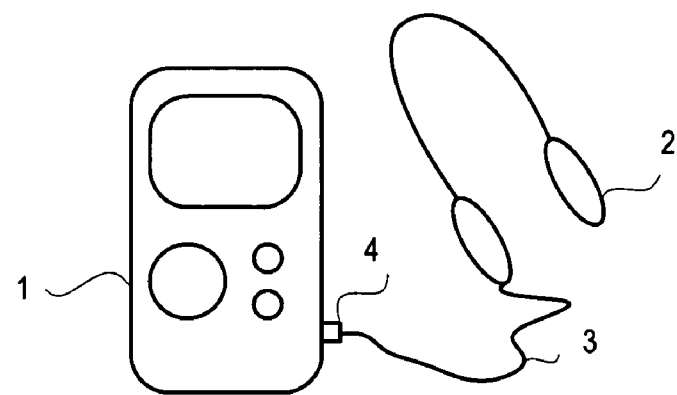
FIGS. 1a to 1c show a portable audio apparatus in different modes of operation.

FIG. 1a shows a portable electronic audio apparatus 1 in a first mode of operation, connected to drive a pair of headphones 2. Apparatus 1 in the illustration is an MP3 player, but the same functions may be integrated into phones and multimedia players, laptop computers, PDAs and the like. Headphones 2 are connected to the apparatus via a lead 3 plugged into output jack 4. The body of the apparatus may also include one or more miniature loudspeakers (not shown), which can be driven as an alternative audio output transducer, but are in principle equivalent to the headphones for the purpose of this description. As is well known, small size and weight, together with maximum battery life, are key attributes of premium products in this market. Manufacturing cost is an important factor across the market.

Figure 1B:
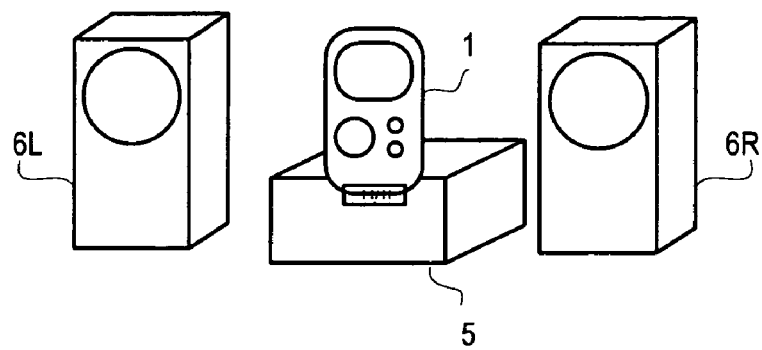
Figure 1C:
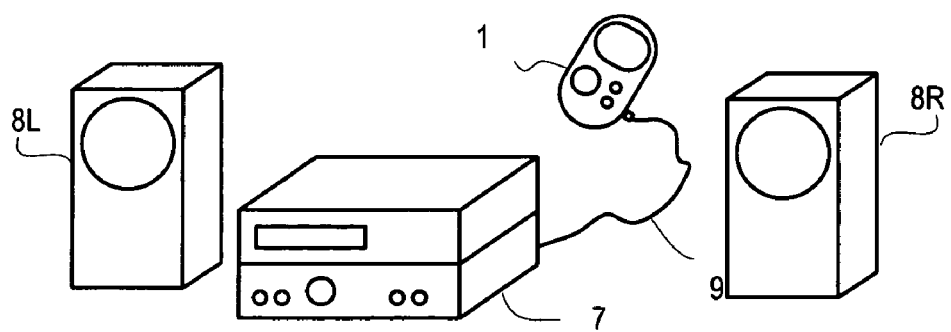

FIG. 1b shows the same apparatus 1 in a second mode of operation, where no headphones are connected. Instead, the apparatus is connected via a separate connector to a docking station 5, which in turn drives larger loudspeakers 6L, 6R. Docking station 5 incorporates a higher powered amplifier than the portable device itself, and a separate power supply, usually mains-powered. FIG. 1c shows the same apparatus in a variation of the second mode, in which an external amplifier 7 and loudspeakers 8L, 8R are connected via a line lead 9 plugged into the headphone jack 4 in place of the headphones.

The apparatus 1 is required to drive very different loads in these modes. A headphone or loudspeaker will typically have an impedance of 32 ohms or less. Into this load, an output amplitude of, say 100 mV RMS will provide a moderate volume, (say −12 dB) from full scale, corresponding to a power 30 mW. When driving the line input of a larger amplifier in the second mode, the load impedance is typically 10 kilohms or more, and a full scale signal amplitude (0 dB) of 2V RMS is appropriate for maximum quality. If the output stage driving the socket in Mode 1 is capable of providing a 2V RMS signal, its supply voltage must be greater than 2V. When driving a headphone load in Mode 1 from the same output stage, most of the output stage power consumption is dissipated in the form of heat, as the supply voltage is dropped to the 100 mV level in the transistors of the output stage. If, to increase battery life, the designer opts not to provide the full 2V RMS for line output situations, a poorer signal is the result.

As a result of these competing requirements, premium products in this market have adopted the practice of providing separate output stages, one used for driving headphone/speaker loads 2, and another for line out situations via the docking connector 4. Each output stage can be driven from a power supply appropriate to the voltage range, maintaining power efficiency and quality in each application. Needless to say, the requirement for separate output stages and separate power supplies for them increases the size and cost of the apparatus undesirably.

Figure 2:
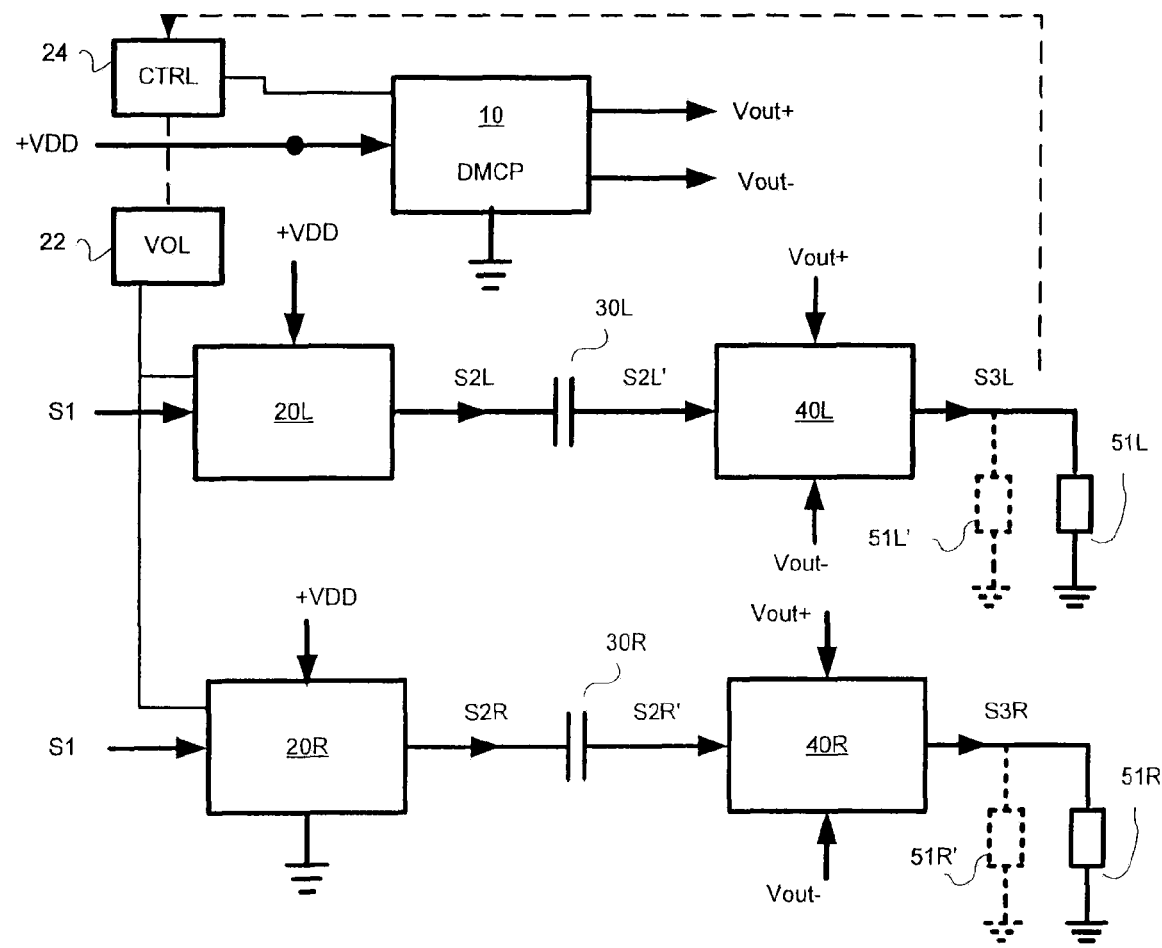
FIG. 2 shows schematically an audio output circuit embodying the present invention suitable for use in the apparatus of FIGS. 1a to 1c.

FIG. 2 shows in block schematic form novel output circuitry for an audio apparatus of the type shown in FIGS.

1a-1c. Here, output stage supply voltages Vout+ and Vout− are generated by a dual mode charge pump (DMCP) circuit 10. DMCP 10 is supplied from a single rail supply voltage VDD, which may be a battery voltage or some intermediate supply generated on board the apparatus. It has different modes of operation which can provide different supply voltages, enabling a common output stage to be used in both headphone and line output modes of use. Novel examples of how DMCP 10 can be implemented in a very compact and cost-effective way are provided later with reference to FIG. 4 onward. In the description that follows, labels VDD, Vout+ etc. are used to refer to either the respective terminals or the voltage at that terminal, according to context.

Referring to FIG. 2, two channels of audio signal processing and output are depicted, with suffices 'L' and 'R' representing left and right channels of stereo audio. The supply voltage VDD is illustrated as supplying processing circuitry 20 in each channel. The input signal S1 maybe an analogue signal or a digital signal. In the case where S1 is an analogue signal then the processing circuitry 20 will be purely analogue type circuitry such as op-amps, multiplexers, gain blocks etc. In the case where S1 is a digital signal and the output stage is analogue, then the processing circuitry 20 may be a mixture of digital and analogue circuitry where signal S1 is fed, either directly or through some digital signal processing, into a DAC (not illustrated) and the output of the DAC is then fed into the analogue circuitry as mentioned above. The processing circuitry may include a volume function, controlled by a volume control 22 as illustrated. Voltage supplies and control circuits are shown as being common to both channels, although they could be duplicated also if desired (for example to reduce cross-talk).

The processing circuitry 20 outputs a processed signal S2 that in this particular embodiment is an analogue signal that is passed into a level shifter 30 that may be implemented by a simple DC-blocking capacitor for example. The level shifted signal S2' is fed into the output amplifier 40 which outputs an amplified output signal S3 to the headphone jack or docking connector. Two alternative loads are illustrated being driven by the amplifier, the headphone or speaker transducer 50 or a line input 50'

The output amplifier 40 could in principle be a switching (Class D or PWM) amplifier, or a 1-bit digital (sigma-delta) type output stage, in which case the signals S1, S2 may be digital in form right through to input to output, or may begin in analogue form and be converted to digital form in the processing circuit 20. The present embodiment assumes a linear amplifier, however.

The input signal S1, if analogue, and analogue signals in the processing circuitry 20, will normally be referenced midway between ground potential and VDD, whereas the level shifted signal S2' is referenced about ground, as required by the output amplifier operating from the split rail supply Vout+, Vout−. Operating from a split-rail supply avoids the need for a DC-blocking capacitor between the output amplifier and the headphone jack. This is important in the trade-of between performance, compactness and cost in the product, because a large capacitor is needed if low frequencies are not to be impaired, and for the output to be tolerant of a wide range of headphone impedances.

In the example of the portable apparatus shown in FIGS. 1a-1c, two modes (or more) can be defined: a Mode 1 may be used to drive a low impedance load such as headphones 3 while Mode 2 may be used to drive a high impedance load such as a line input. In the case where a docking connector, separate from headphone jack 4, is used in Mode 2 (FIG. 1b), the control circuit can decide directly which mode applies, from a general signal indicating docked status. As mentioned already, performance, size and cost are conflicting requirements when driving headphones at one time and line inputs at another. Rather than provide separate output stages for these modes, the present application proposes to use common output stage components in both modes, but switching to different power voltages. To enable this, the supplies Vout+ and Vout− are generated differently by the Dual Mode Charge Pump 10 in each mode, preferably using novel charge pump arrangements as described below.

For Mode 1 (headphone) operation, the output stage supply voltages Vout+ and Vout− are substantially +VDD/2 and −VDD/2. In this way, the wasteful voltage drop across the output stage transistors when driving the load at low voltage is greatly reduced, and battery life and cooling requirements relaxed substantially. For Mode 2 operation (line output), the DMCP can generate for example +VDD and −VDD supplies, permitting the output amplifier to drive a full scale signal of greater than 1V RMS.

The mode of operation of DMCP 10 is determined by control circuit 24. Where the same jack 4 is used in Mode 2 as in Mode 1, mode selection may be determined in several ways. As a first option, a switch or menu option may be available to the user to select explicitly between sound and line output modes. The user setting may alternatively be implicit in the act of turning the volume control 22 to full scale, on the assumption that headphones will not be used at the maximum level in practice. Alternatively it may be possible to sense the by automatically sensing the output impedance or output current supply or even jack socket versus docking station operation in the case of a portable audio device. These options are indicated by dashed lines in the drawing.

In the case of using the volume control to "Mode select", setting the charge pump to Mode 2 could in principle overdrive the headphones, damaging them and/or damaging the hearing of the user. This risk is mitigated by the fact that, in practice, should the volume be set high under normal circumstances, the output supply voltages will collapse due to the fact that the load's power requirements are greater than that for which the DMCP 10 has been designed. Nevertheless, specific safeguards in the form of extra circuitry (not illustrated), can be put in place to monitor for such a situation so as to disable the DMCP 10 or another part(s) of the circuitry. Alternatively, the effective output resistance of the output amplifier 40 or its voltage supply can be increased under control of the mode selection signal, thereby to limit the current deliverable at the outputs. An additional 100 ohms resistance will not be significant when placed in series with 10 kilohms or more at a line input, while it will significantly limit the current that can be put through a 32 ohm load.

For cost and size reasons, it is important to be able to integrate the functions of an MP3 player, mobile phone or any other application into a small number of integrated circuits. Therefore it is advantageous to integrate the circuitry for supply voltage generation, in this case the DMCP 10, together with the functional circuitry 20, 30, 40 etc. Generally speaking, the DMCP 10 includes capacitors which cannot realistically be integrated and have to be located off-chip, with consequences for chip-pin-count and overall circuit size. The DMCP examples to be described use novel charge pump circuits to minimise size and/or maximise performance, and also to divide the input voltage into half or even smaller fractions, reducing power dissipation in Mode 1 particularly.

Examples of Dual Mode Charge Pump construction and operation will now be described.

Figure 3:
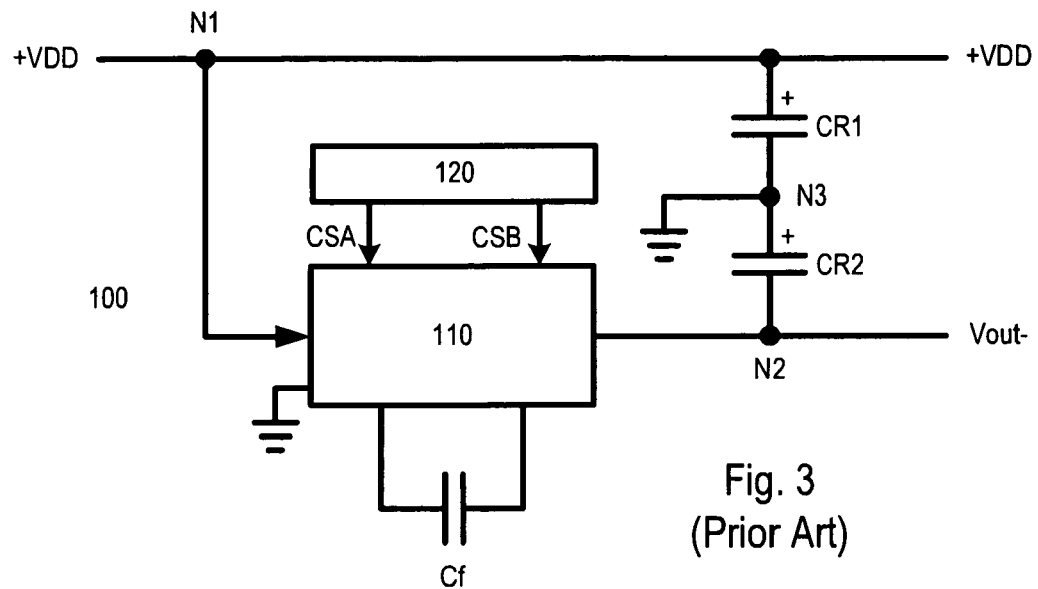
FIG. 3 shows a prior art inverting charge pump circuit.

FIG. 3 illustrates, for background purposes, a prior art inverting charge-pump (ICP) circuit 100 which generates a negative output voltage (Vout−) from a positive input voltage (+VDD). In ideal conditions Vout− will substantially equal −VDD thus resulting in a total voltage across the nodes N1-N2 of 2×VDD. The circuit 100 comprises three capacitors, one flying capacitor Cf and two reservoir capacitors CR1, CR2, and a switch array 110. Circuit 100 is controlled by a controller 120 which controls the switch array 110 thus causing circuit 100 to switch between two main states as explained below.

To generate the voltage Vout−, the controller operates the switch array 110 to repeat the following steps at a high frequency. Firstly, flying capacitor Cf is connected between the input voltage node N1 and the common reference voltage node N3 (as illustrated in FIG. 2b). Therefore the flying capacitor Cf charges up to voltage +VDD. Subsequently, flying capacitor Cf is connected in parallel with the negative reservoir capacitor CR2, that is its connected across the common reference voltage node N3 and the output voltage node. Assuming capacitor CR2 is initially charged to zero volts in this first cycle, capacitor CR2 will share charge with capacitor Cf, to give an equal voltage across each capacitor. Since the positive plates of capacitors Cf and CR2 are connected to the common reference voltage node N3 (ground), node N2 sees a voltage somewhat more positive than −VDD relative to node N3, depending on the respective sizes of Cf and CR2.

In each cycle, capacitor CR2 will be further charged, eventually reaching a steady state after a plurality of 4-step cycles. By this time, capacitor CR2 is already charged to (and therefore Vout− equals) substantially −VDD, and consequently Cf no longer adds any further significant charge so long as no current is drawn by the load. If a load is applied to Vout−, it will continuously discharge capacitor CR2. This charge is then replaced by charge from capacitor Cf, resulting in Vout− being somewhat more positive than −VDD. The average difference and voltage ripple will depend on the values of Cf, CR2, the switching frequency and the load characteristics. The frequency will be chosen to be far above the audio frequency band of the signals being processed, for example 100 kHz or more.

It should be noted that a closed-loop feedback control can be added to the charge pump, by which the output voltage Vout− can be regulated such that it is anywhere between approximately ground potential and −VDD. However, the charge pump itself is most efficient when the output voltage Vout− equals −VDD. In practice the target voltage will probably be set slightly above −VDD in order to reduce ripple.

The prior art charge pump circuits 100 can only generate output voltage −VDD, meaning that the rail-to-rail magnitude of the amplifier supply is greater than the input voltage (VDD−(−VDD)=2VDD). This can be disadvantageous in certain applications, as it may not allow the circuitry being supplied to run efficiently, for example when such an circuit is being used to power circuitry that amplifies a signal with a maximum amplitude much smaller than the amplifier circuitry's power supply +/−VDD.

Figure 4A:
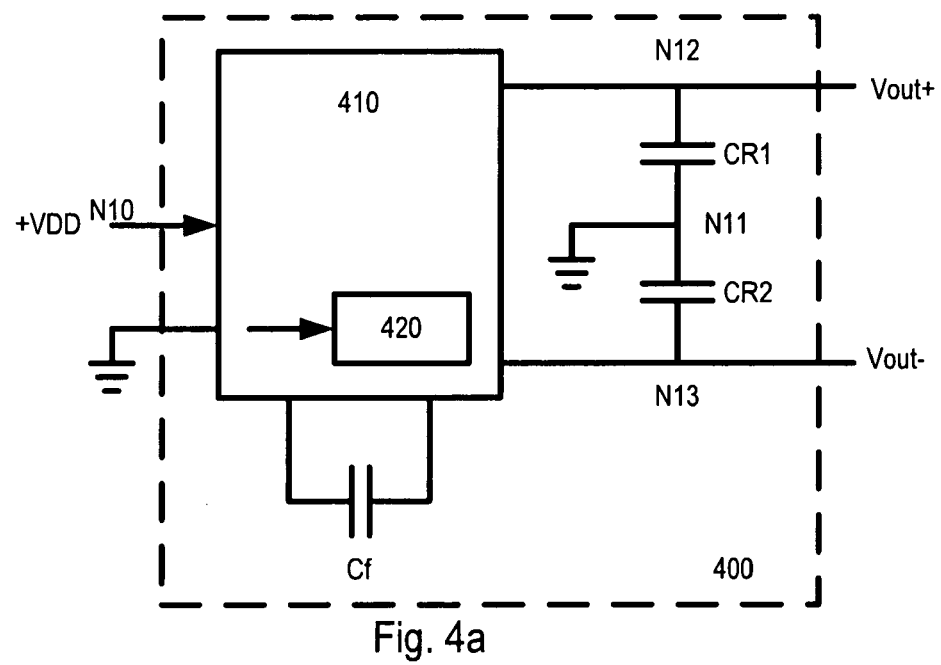
FIG. 4a shows a Dual Mode Charge Pump circuit according to an embodiment of the invention.

FIG. 4a illustrates a novel dual mode charge-pump (DMCP) circuit 400 which comprises three capacitors—one flying capacitor Cf and two reservoir capacitors CR1, CR2—and a switch array 410. DMCP 400 is a first example for a circuit suitable for use as the DMCP 10 in the apparatus of FIGS. 1a-1c and 2. Circuit 400 is controlled by a controller 420 which controls the switch array 410 thus causing circuit 400 to switch between various states to implement the different modes of operation, as explained below. Clock signals (not shown) are provided to the controller, which may be generated within DMCP 400 or shared with other circuitry on chip. The circuit 400 in operation uses flying capacitor Cf to transfer packets of charge from an input supply to the reservoir capacitors at high frequency, in such a way as to generate positive and negative output voltages (Vout+ & Vout−) from a positive input voltage (+VDD). The values of these output voltages depend on the mode selected. To aid explanation, various circuit nodes are labelled, including node N10 connected to receive the input supply voltage VDD, node N11 being a common (ground) node and nodes N12 and N13 forming the output terminals for Vout+ and Vout− respectively.

Connected to the outputs Vout+, Vout−, and N11 (0V) is a load 450. In reality this load 450 may be wholly or partly located on the same chip as the power supply, or alternatively it may be located off-chip. Example applications will be described with reference to FIGS. 23 to 25 below.

As its name implies, DMCP 400 is operable in two main modes. All of these modes will be explained in more detail below. Naturally the principles of the dual mode circuit can be extended to multiple modes.

In the first main mode, referred to below as Mode 1, the DMCP 400 operates such that, for an input voltage +VDD, the DMCP 400 generates outputs each of a magnitude which is a half of the input voltage VDD. In other words, the output voltages generated in this first mode are nominally of magnitude +VDD/2 and −VDD/2. When lightly loaded, these levels will, in reality, be +/−(VDD/2−Iload.Rload), where Iload equals the load current and Rload equals the load resistance. It should be noted that, in this case, the magnitude (VDD) of output voltage across nodes N12 & N13 is the same, or is substantially the same, as that of the input voltage (VDD) across nodes N10 & N11, but shifted. This mode may therefore be referred to as a 'level shifting' mode. In the second main mode (Mode 2) the DMCP 400 produces a dual rail output of +/−VDD.

This particular form of charge pump has significant advantages over known circuits, in particular because of the ability to generated a reduced, bipolar supply using only a single flying capacitor. Prior circuits for generating reduced output voltages requires additional flying capacitors. The flying capacitor and reservoir capacitors are often of a size that they need to be located off-chip, and so eliminating one capacitor and two IC pins is highly beneficial. The present invention not to be taken as being limited in its application to the particular form of DMCP illustrated here, however, and is potentially applicable in other multi-mode charge pump circuits whether they be known or, as yet, unknown.

Figure 4B:
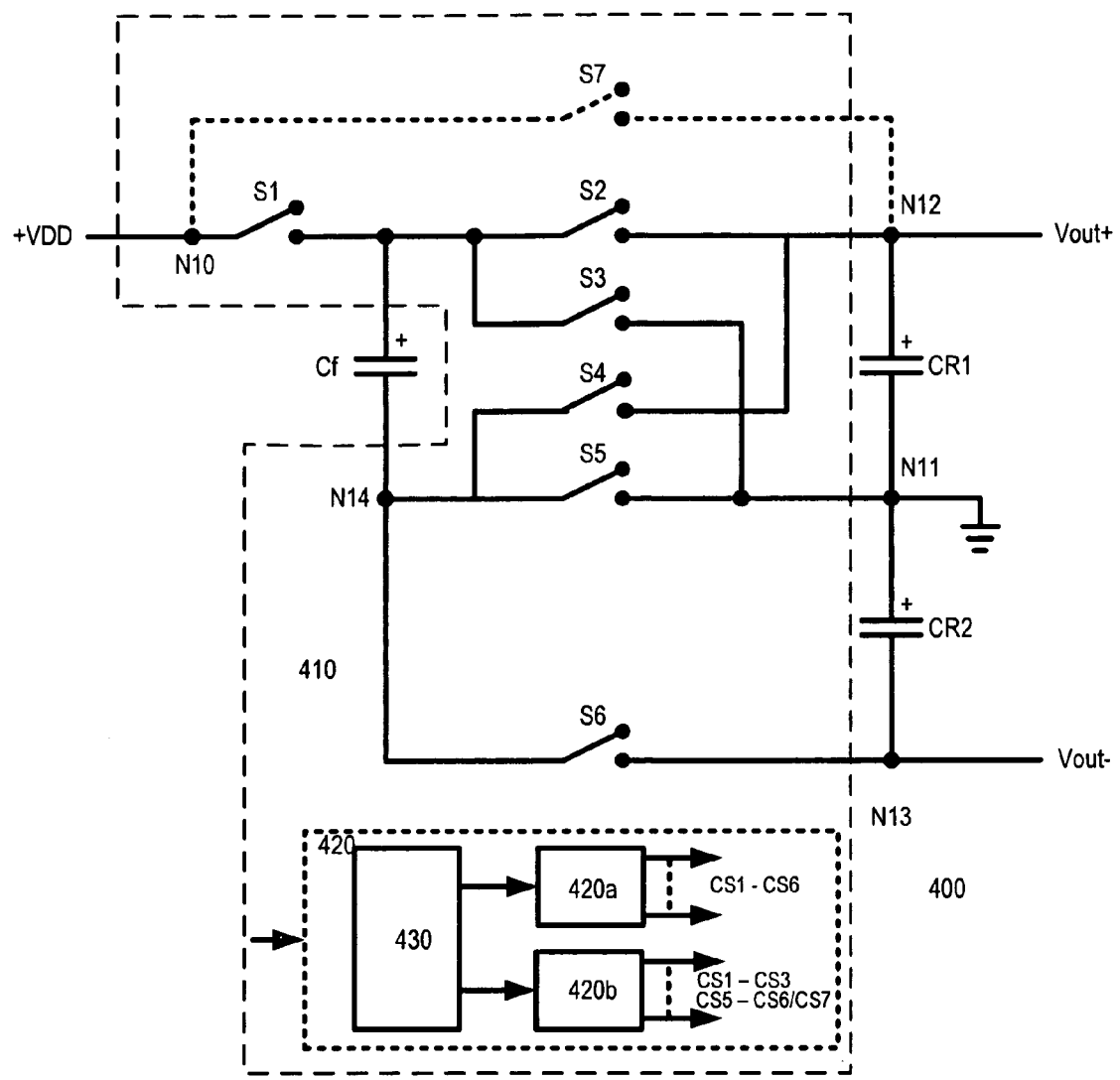
FIG. 4b shows the same circuit as FIG. 4a with internal detail of the charge pump switch array and control module.

FIG. 4b shows more internal detail of the DMCP 100. Here it can be seen that the switch array 410 comprises six main switches S1-S6 each controlled by corresponding control signal CS1-CS6 from the switch control module 420. The switches are arranged such that first switch S1 is connected between the positive plate of the flying capacitor Cf and the input voltage source, the second switch S2 is between the positive plate of the flying capacitor and first output node N12, the third switch S3 is between the positive plate of the flying capacitor and common terminal N11, the fourth switch S4 is between the negative plate of the flying capacitor and first output node N12, the fifth switch S5 is between the negative plate of the flying capacitor and common terminal N11 and the sixth switch S6 is between the negative plate of the flying capacitor and second output node N13. Optionally, there may be provided a seventh switch S7 (shown dotted), connected between the input voltage source (node N10) and first output node N12. These switches are the ones appropriate to the modes to be described. The provision of further switches to enable other modes of operation is of course not excluded.

It should be noted that the switches can be implemented in a number of different ways (for example, MOS transistor switches or MOS transmission gate switches) depending upon, for example, an integrated circuit's process technology or the input and output voltage requirements. The selection of appropriate implementations is well within the capability of the skilled reader.

Also shown in greater detail is the control module 420 which, at least notionally, comprises mode select circuit 430 for deciding which of two control functions 420*a*, 420*b* to use, thus determining which mode the DMCP operates in. The mode select circuit 430 and the controllers 420*a*, etc. are notional blocks in that they represent different behaviours of the control module in implementing different operating modes of DMCP 400. They can be implemented by separate circuits as just described. In practice, they are just as likely to be implemented by a single circuit block or sequencer with hardwired logic and/or sequencer code determining which behaviour is implemented at a given time. As also described below, where a given mode can be implemented in a range of variants, the designer may select variants which simplify the generation of the control signals, when all the different modes are considered together.

DMCP Operation—Mode 1

In a main operational embodiment of Mode 1, there are three basic states of operation, repeated in high-frequency cycles of three phases, which may be referred to as P1, P2, P3. When DMCP 400 is operating in Mode 1, switch S7, where present, is always open and is therefore not shown when describing this mode.

Figure 5A:
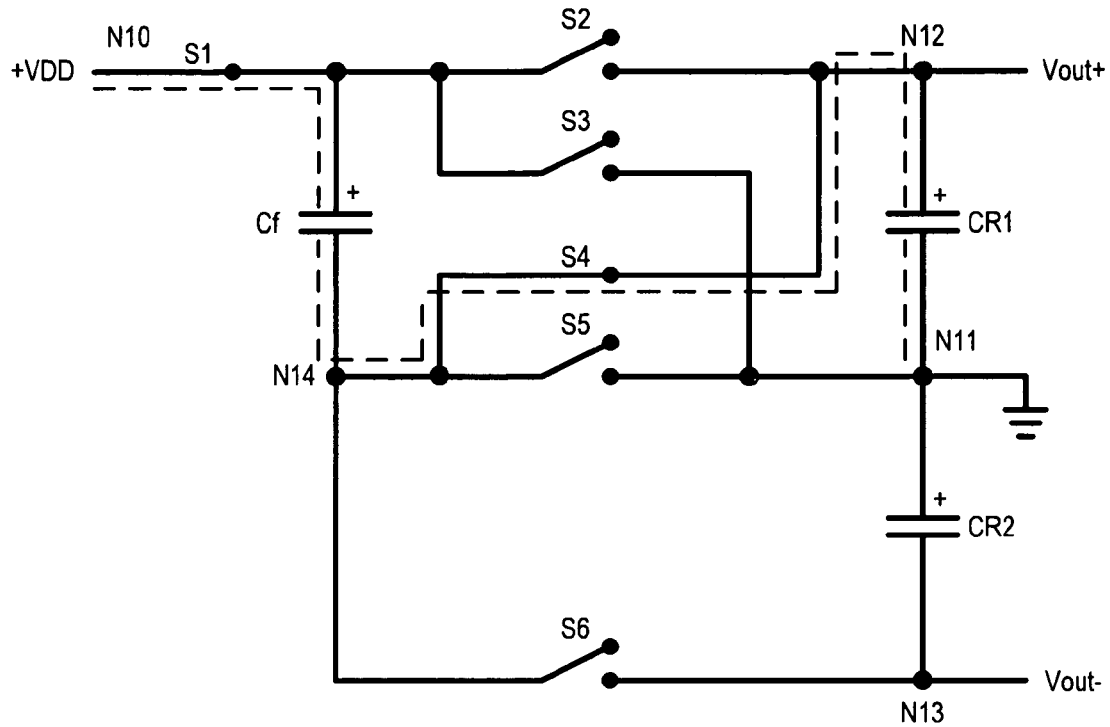
FIGS. 5a and 5b show, respectively, the circuit with the switch array in a first state and an equivalent circuit of this state.
Figure 5B:
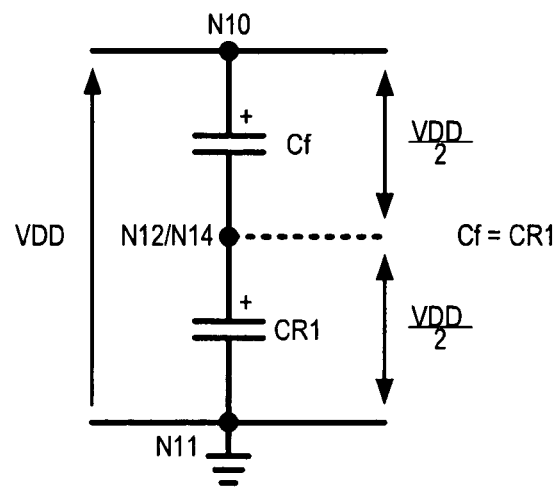

FIGS. 5*a* and 5*b* show the switch array 410 operating in a first state, "State 1". Referring to FIG. 5*a*, switches S1 and S4 are closed such that capacitors Cf and CR1 are connected in series with each other and in parallel with the input voltage +VDD. Therefore, capacitors Cf and CR1 share the input voltage +VDD that is applied across them. FIG. 5*b* shows an equivalent circuit for the state 1 operation with voltage +VDD effectively applied across nodes N10 & N11.

It is preferable for applications that require symmetrical, but opposite polarity, output voltages, that the values of capacitors Cf and CR1 are equal such that each capacitor Cf, CR1 changes voltage by an equal increment when connected in series across a voltage source. If both capacitors are initially discharged, or indeed previously charged to any equal voltages, they will end up each with a voltage equal to half the applied voltage source, in this case one half of the input voltage VDD.

Figure 6A:
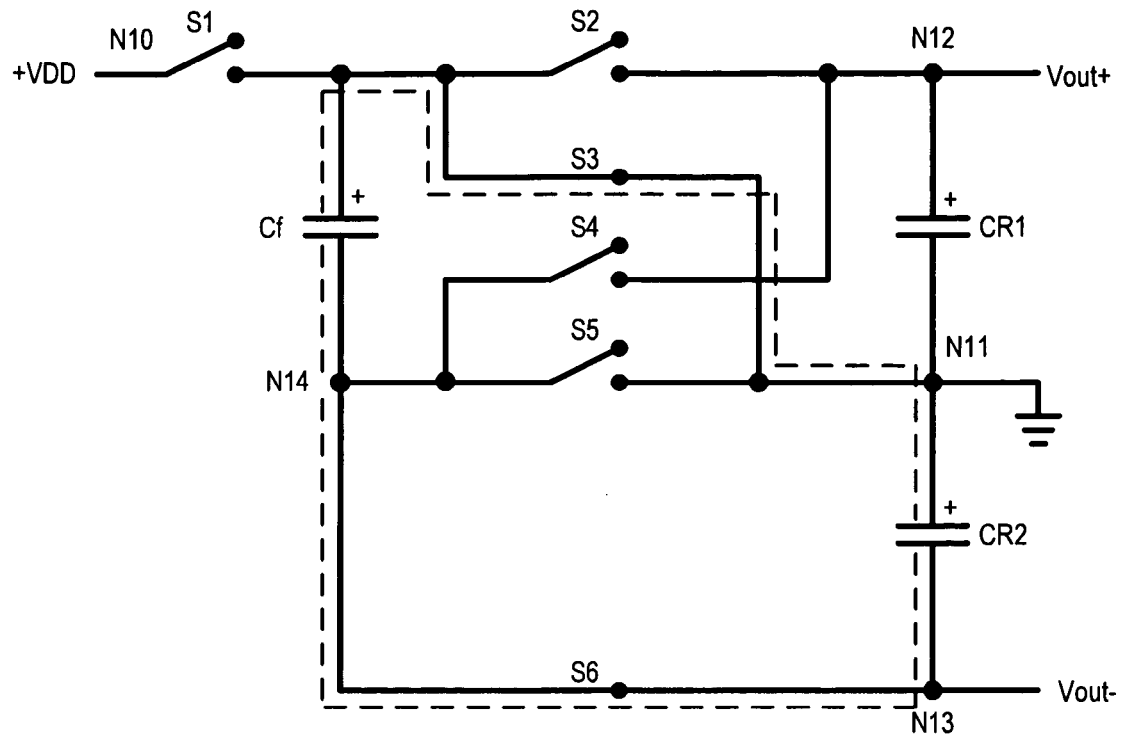
FIGS. 6a and 6b show, respectively, the circuit with the switch array in a second state and an equivalent circuit of this state.
Figure 6B:
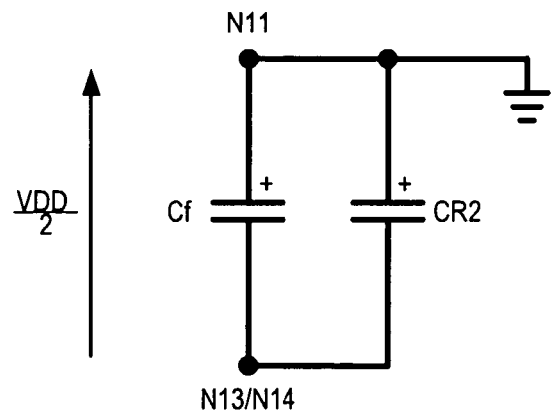

FIGS. 6*a* and 6*b* show the switch array 410 operating in a second state, "State 2". Referring to FIG. 6*a*, switches S3 and S6 are closed such that capacitors Cf and CR2 are connected in parallel with each other and between nodes N11 and N13. Therefore, the voltage across capacitor Cf equalises with that across capacitor CR2. FIG. 6*b* shows an equivalent circuit for this State 2 condition.

It should be noted that the value of reservoir capacitor CR2 does not necessarily need to be the same as that of flying capacitor Cf. If capacitor CR2 is much larger than capacitor Cf, it will require more cycles to charge up to or close to VDD/2. The value of reservoir capacitor CR2 should be chosen depending upon expected load conditions and required operating frequency and output ripple tolerance.

Over a plurality of cycles alternating only States 1 and 2, the voltages across the capacitors Cf and CR2 would, under ideal conditions, converge to a voltage +/−VDD/2. However, the presence of a significant load on the charge pump's output terminals will result in a respective voltage droop in Vout+, Vout− away from +/−VDD. If the load is symmetric, and there is equal current magnitude on both Vout+ and Vout−, then the symmetry of the system will result in both outputs drooping by the same amount.

However, if, for example, there is a significant load on Vout+ but no load or a light load on Vout−, then the voltage across capacitor CR1 will reduce. This will result in a larger voltage across capacitor Cf at the end of State 1 which will then be applied to capacitor CR2 in State 2. If only States 1 and 2 were used, the flying capacitor Cf would then be connected in series with capacitor CR1 in State 1 but still having a larger voltage across it, even initially. Therefore, voltages Vout+ and Vout− will both tend to droop negatively, that is to say that the common mode is not controlled.

Figure 7A:
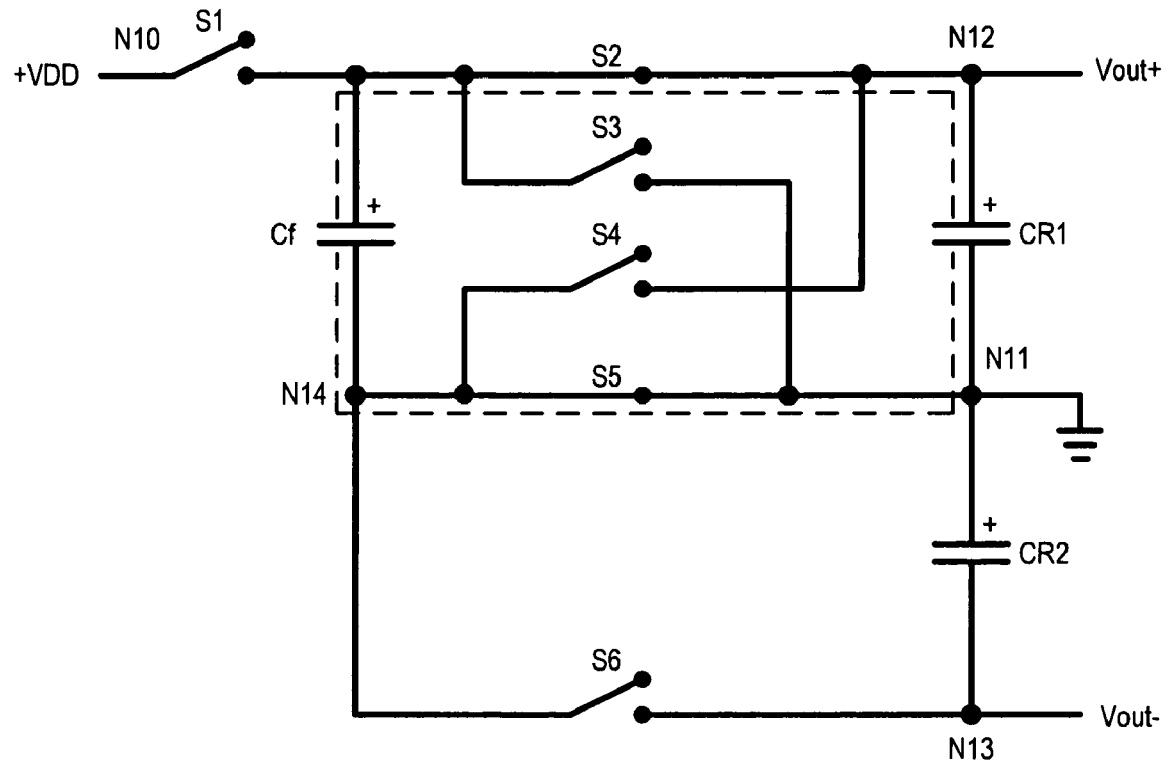
FIGS. 7a and 7b show, respectively, the circuit with the switch array in a third state and an equivalent circuit of this state.
Figure 7B:
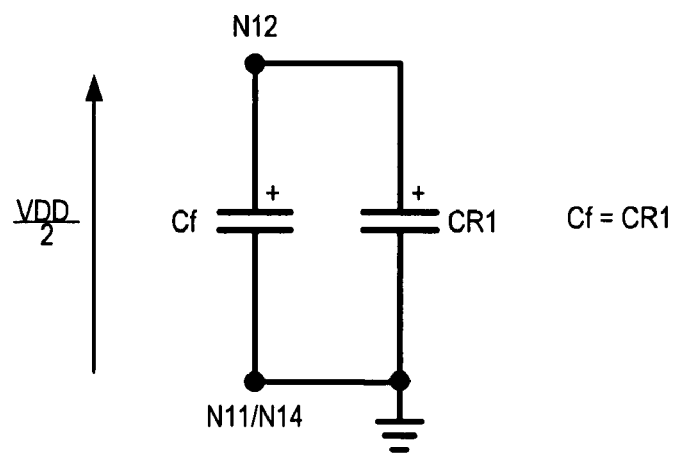

To avoid this effect, a third state, State 3, is introduced, and States 1 to 3 are repeated in Phases 1 to 3 over successive cycles. FIGS. 7*a* and 7*b* show the switch array 410 operating in this State 3 operation. Referring to FIG. 7*a*, in State 3, switches S2 and S5 are closed such that capacitors Cf and CR1 are connected in parallel with each other and between nodes N11 and N12. Therefore, both capacitors Cf and CR1 become charged up to an equal voltage, despite any difference between of their previous voltages. In steady state (after many cycles) this becomes approximately VDD/2. FIG. 7*b* shows an equivalent circuit for this State 3 condition.

The circuit, therefore ends State 3 with equalised voltages, after which it returns to State 1. Consequently the circuit will, in principle, enter Phase 1 of the next cycle in State 1 with Vout+=+VDD/2, depending upon load conditions and switching sequence.

In States 2 and 3, the voltages across the various capacitors that are connected in parallel may not actually, in practice, completely equalise in a single sequence, particularly if the switching frequency is high, relative to the DMCP's R-C time constant. Rather, in each sequence of states a contribution of charge will be passed from capacitor to capacitor. This contribution will bring each output voltage to the desired level under zero, or low, load conditions. Under higher load conditions, the output reservoir capacitors CR1, CR2 will typically achieve a lower voltage (with some ripple). The size of each of the capacitors needs simply to be designed such that the reduction of common mode drift is within acceptable bands, for all expected load conditions, Alternatively, or in addition, larger switches, with less on-resistance, could be employed.

Figure 8:
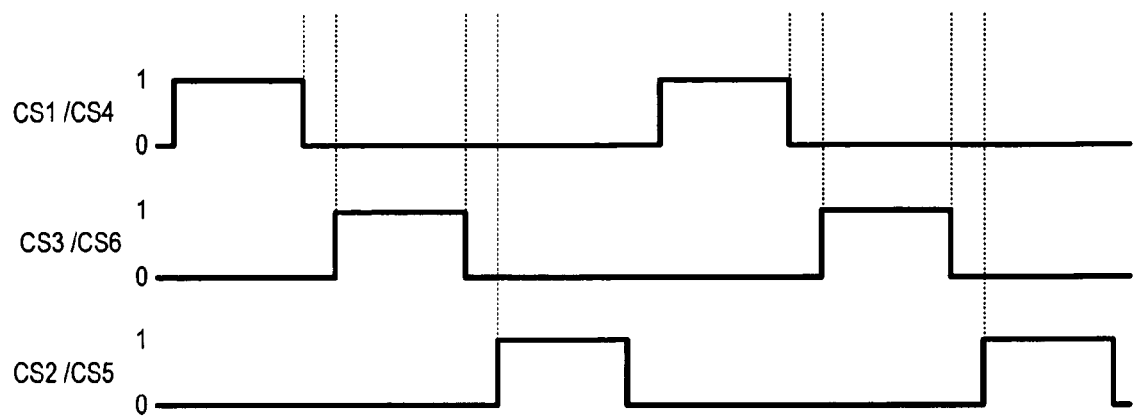
FIG. 8 is a timing diagram showing three switch control signals for the circuit of FIGS. 1 and 2 operating in a first main mode (Mode 1)

FIG. 8 illustrates the non-overlapping control signals (CS1-CS6) for controlling the switches (S1-S6) during the three states (1, 2 and 3) of the main operational embodiment of Mode 1. As discussed above, this represents only one example out of many possibilities for the controlling sequence.

It should be appreciated that the open-loop sequencing of the above three states does not necessarily need to be observed. For example the state sequences could be: 1, 2, 3, 1, 2, 3 . . . (as described above); or 1, 3, 2, 1, 3, 2 . . . ; or 1, 2, 1, 3, 1, 2, 1, 3. It should also be apparent that it is not necessary that the third state be used as often as the other two states, for instance a sequence of 1, 2, 1, 2, 1, 2, 3, 1 . . . can be envisaged. It may even be envisaged to dispense with the third state altogether, albeit only in the case of well-balanced loads, or with alternative schemes for common-mode stabilisation.

Other switching and sequencing scenarios exist. For example, in one alternative operational Mode 1 embodiment: State 1 could be replaced by a fourth state, "State 4" whereby switches S1 and S5 are closed (all other switches are open). In this state capacitor Cf charges up to input voltage +VDD. A fifth state, "State 5" would then operate with switches S2 and S6 closed (all other switches open) such that flying capacitor Cf is connected across reservoir capacitors CR1 and CR2 in series (which, in this scenario, may be equal in capacitance). This particular example of an alternative switching and sequencing scenario has the drawback that there is no common-mode control and therefore would suffer from common-mode drift. However, this common-mode drift can be "reset" by altering the switching sequence at appropriate intervals during the "normal" switching and sequencing cycle. These alterations can be predetermined, or initiated in response to observed conditions.

It should be noted that the sizes of capacitors Cf, CR1, CR2, can be selected to meet the required ripple tolerances (versus size/cost) and consequently the clock phase duration for each state need not necessarily be of ratio 1:1:1.

While the above describes an embodiment wherein Mode 1 generates outputs of +/−VDD/2, it will be understood by the skilled person that the above teaching could be used to obtain outputs of any fraction of VDD by increasing the number of flying capacitors Cf and altering the switch network accordingly. The relationship between output and input in this case is Vout+/−=+/−VDD/(n+1) where n equals the number of flying capacitors Cf. It will also be appreciated that circuits with more than one flying capacitor as described will still be capable of generating outputs of +/−VDD/2 as well as outputs for every intermediate integer denominator between +/−VDD/2 and +/−VDD/(n+1) depending on its control. For example, a circuit with two flying capacitors can generate outputs of VDD/3 and VDD/2, one with three flying capacitors can generate outputs of VDD/4, VDD/3 and VDD/2 and so on.

DMCP Operation—Mode 2

As mentioned above, the DMCP is also operable in a second mode, Mode 2, where it produces a dual rail output of +/−VDD (+VDD again being the input source voltage level at node N10). In Mode 2, switch S4 is always open.

Furthermore, in Mode 2, the circuit is operable in four sub-Modes, referred to as Modes 2a, 2b, 2c and 2d. Optional switch S7 is only used in Modes 2c and 2d. Consequently, if switch S7 is not included, Mode 2 is only operable in sub-Modes 2a and 2b.

Figure 9A:
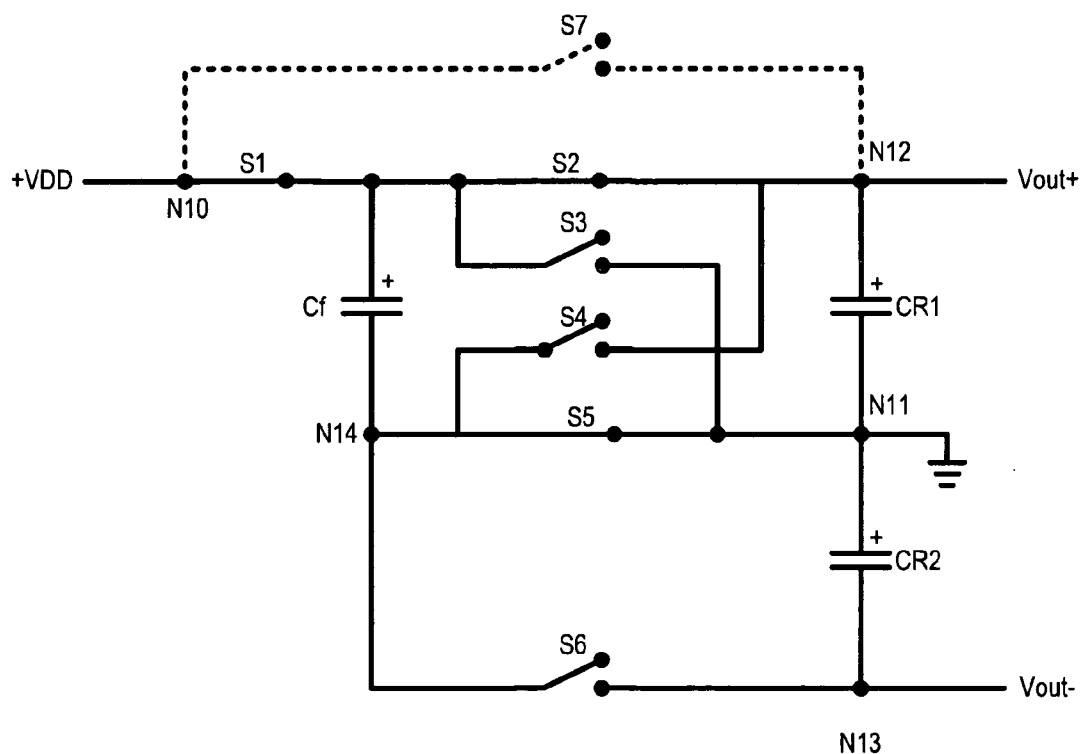
FIGS. 9a and 9b show, respectively, the circuit with the switch array in a sixth state and an equivalent circuit of this state.
Figure 9B:
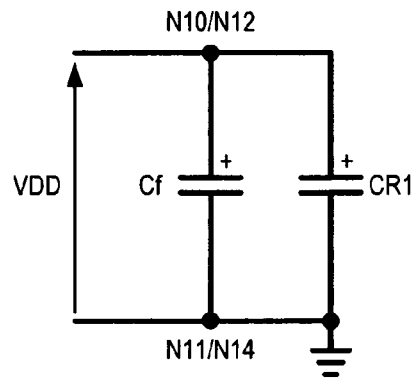

In Mode 2a the DMCP has two basic states of operation. FIG. 9a shows the circuit operating in the first of these states, "State 6". In this state, switches S1, S2 and S5 are closed (S3, S4 and S6 are open). This results in capacitors Cf and CR1 being connected in parallel across the input voltage +VDD, between nodes N10 & N11. Therefore, capacitors Cf and CR1 each store the input voltage +VDD. FIG. 9b shows an equivalent circuit for the State 6 operation.

Figure 10A:
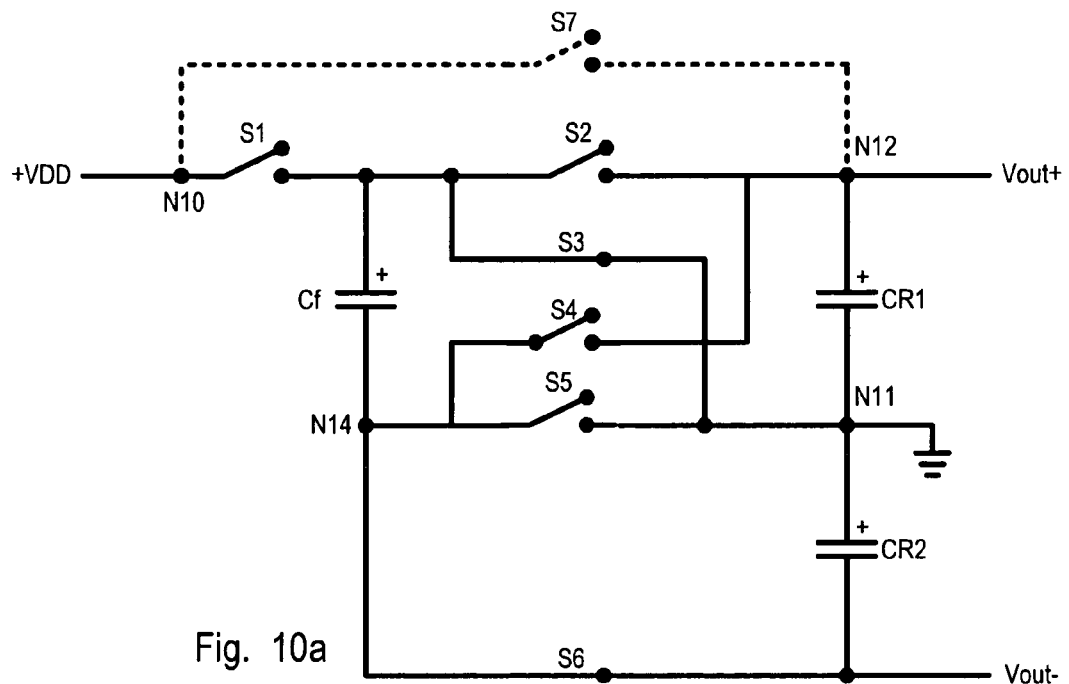
FIGS. 10a and 10b show, respectively, the circuit with the switch array again in the second state and an equivalent circuit of this state.
Figure 10B:
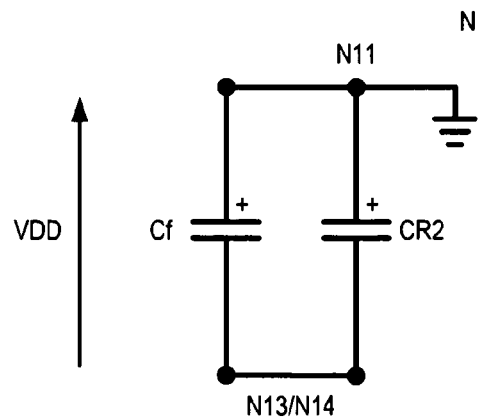

FIG. 10a shows the circuit operating in the second of these states, "State 2", which is, in fact, the same state as state 2 in Mode 1, whereby switches S3 and S6 are closed (S1, S2, S4 and S5 are open). Therefore capacitors Cf and CR2 are connected in parallel between common node N11 and second output node N13. Therefore, capacitors Cf and CR2 share their charge and Node 13 exhibits a voltage of −VDD after a number of state sequences. FIG. 10b shows an equivalent circuit for this State 2 of operation.

Figure 11:
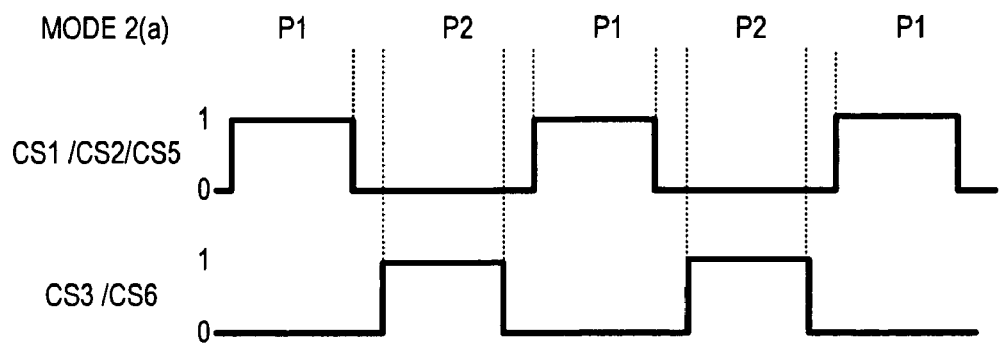
FIG. 11 is a timing diagram showing control signals in a first variant of a second main mode of operation (Mode 2(a))

FIG. 11 illustrates the non-overlapping control signals (CS1-CS3 & CS5-CS6) for controlling the switches (S1-S3 and S5-S6) during the two alternating states of Mode 2(a). The sequence of states in this mode is therefore 6, 2, 6, 2, 6, . . . etc.

Figure 12A:
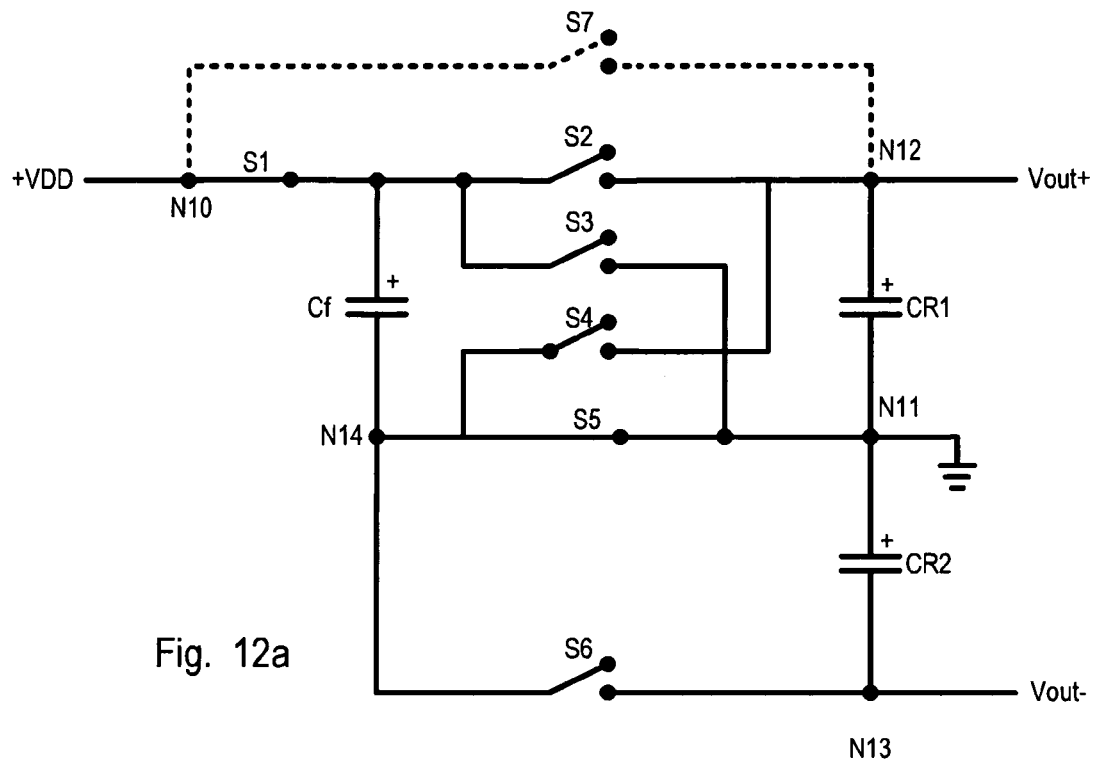
FIGS. 12a and 12b show, respectively, the circuit with the switch array in a seventh state and an equivalent circuit of this state.
Figure 12B:
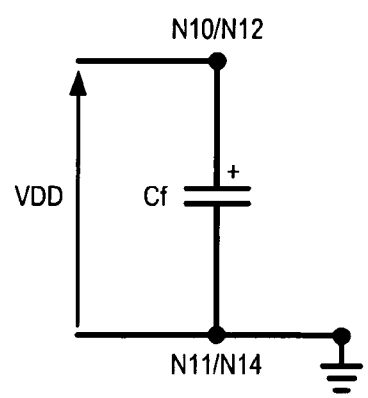

FIG. 12a shows an additional state, "State 7", which can be introduced into this Mode 2(a) sequence to create a slightly different implementation, referred to now as Mode 2(b). In State 7, switches S1 and S5 are closed (S2, S3, S4 and S6 are open). This state 7 connects the flying capacitor Cf across the input voltage +VDD. This state can be followed by states 6 then 2 and then back to 7 etc. FIG. 12b shows an equivalent circuit for this State 7 operation.

Figure 13:
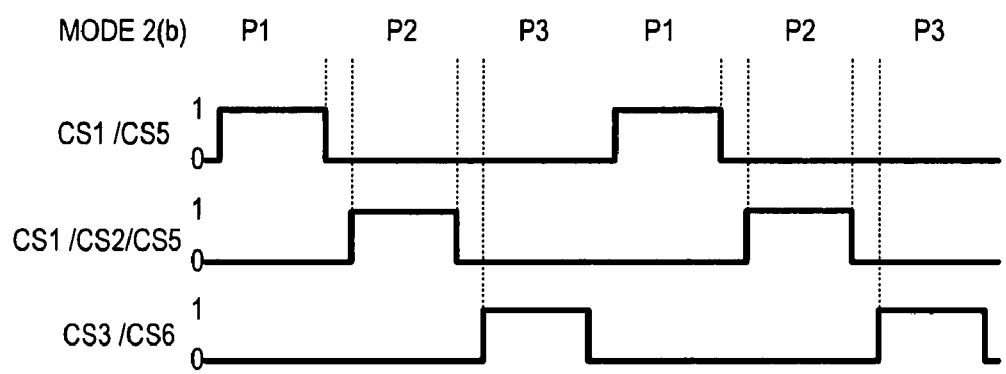
FIGS. 13, 14 and 15 are timing diagrams showing switch control signals in second, third and fourth variants of the second main mode of operation (Mode 2(b), 2(c), 2(d) respectively)

FIG. 13 illustrates the non-overlapping control signals (CS1-CS3 & CS5-CS7) for controlling the switches (S1-S3 and S5-S7) to generate a repeating sequence of the three states 7, 6, 2, 7, 6, 2, etc. . . . that defines Mode 2(b). Again, this represents only one example out of many possibilities for the controlling sequence. The inclusion of State 7 before State 6 is intended to isolate CR1 from the influence of CR2, and hence combat cross-regulation. On the other hand, the inclusion of State 7 reduces the time available for charge transfer in the main States 2 and 6, so that regulation as a whole may be improved if State 7 is simply omitted (Mode 2(a)). These are design choices.

Whichever pattern is chosen, one of the states may be used less frequently than the others (as was described above in relation to Mode 1). For instance, if the loads on the two output nodes N12, N13 are unbalanced (either permanently or according to signal conditions), one of the States 6 and 2 could be included less frequently than the other, as capacitor CR1 may need to be charged less frequently than capacitor CR2 or vice versa.

Modes 2(c) and (d) are further alternative modes of operation to generate +/−VDD, which are possible when the DMCP is provided with switch S7. This switch may used to replace the combined functionality of switches S1 and S2 for generating the positive output voltage at node N12 in applications where the high-side load, i.e. the load connected between nodes N12 and N11, does not require a lot of current. This may be where the load has a high input resistance as with a "Line Output" for a mixer for example. In such a case the size and the drive requirements of switch S7 can be reduced and modified compared to those of switches S1 and S2. Indeed, switch S7 can be constantly switched on during operation in Mode 2(c) which has advantages in that there is less power required to drive the switches and switch S7 would not, in the case of a MOS switch implementation, inject any charge into either nodes N10 or N12 due to its parasitic gate-drain and gate-source capacitances. It should also be noted that switch S1 is still required to operate so as to generate the negative output voltage −VDD. Still further, it should be noted that switch S2 may be operated on an infrequent basis so as to also connect the flying capacitor Cf and high-side reservoir capacitor CR1 in parallel.

Figure 14:
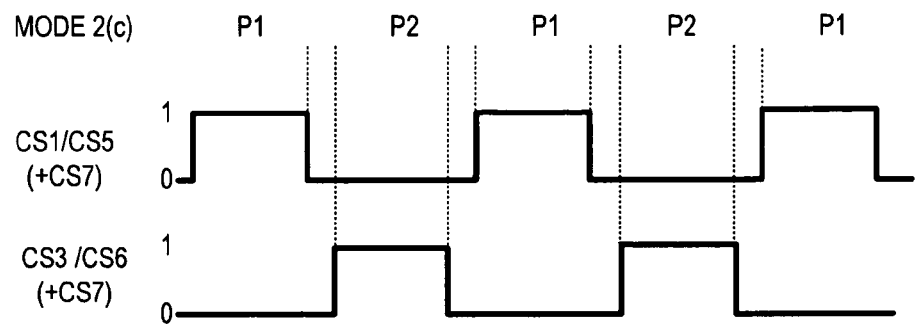

FIG. 14 illustrates the non-overlapping control signals (CS1-CS3 & CS5-CS7) for controlling the switches (S1-S3 and S5-S7) during the two alternating states of Mode 2(c). Summarising Mode 2(c), therefore, switch S7 is permanently (or near permanently) closed. A modified State 6 is used to charge the flying capacitor Cf and capacitor CR1 in parallel, this now being achieved by having switches S1, S5 and S7 closed only. A modified State 2 is then used to transfer this charge to capacitor CR2 via switch S3, S6 as before, but this time with capacitor CR1 still having voltage VDD across it due to S7 being closed.

Figure 15:
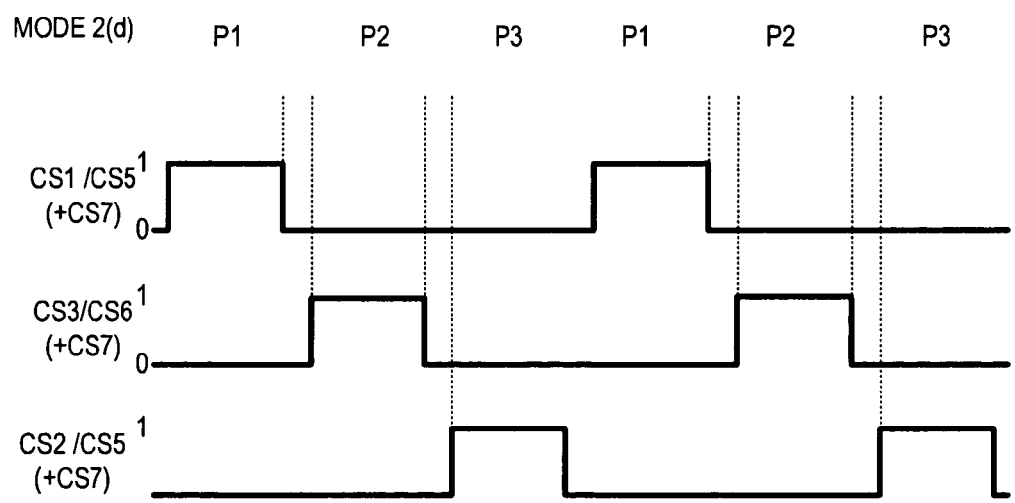

FIG. 15 illustrates non-overlapping control signals (CS1-CS3 & CS5-CS7) for controlling the switches (S1-S3 and S5-S7) during three states in a variation of Mode 2(c) referred to as Mode 2(d). The difference relative to Mode 2(c) is similar to the difference between Modes 2(a) and 2(b), in that an extra phase is inserted with the switches in State 7, wherein switches S1 and S5 are closed (S2, S3, S4 and S6 are open; S7 can remain closed throughout). Note that Mode 2(d) follows a sequence 7, 2, 6, 7, 2, 6 . . . rather than 7, 6, 2. There is not necessarily any great difference in the effect of these modes, but the freedom to vary the sequence can simplify the control logic, as will be seen in the discussion below.

TABLE 1

|  | S1 | S2 | S3 | S4 | S5 | S6 | S7* |
|---|---|---|---|---|---|---|---|
| State 1 | 1 | 0 | 0 | 1 | 0 | 0 | 0 |
| State 2 | 0 | 0 | 1 | 0 | 0 | 1 | 1++ |
| State 3 | 0 | 1 | 0 | 0 | 1 | 0 | 0 |
| State 4 | 1 | 0 | 0 | 0 | 1 | 0 | 0 |
| State 5 | 0 | 1 | 0 | 0 | 0 | 1 | 0 |
| State 6 | 1 | 1 | 0 | 0 | 1 | 0 | 0 |
| State 6+ | 1 | 0 | 0 | 0 | 1 | 0 | 1 |
| State 7 | 1 | 0 | 0 | 0 | 1 | 0 | 0 |
| State 7++ | 1 | 0 | 0 | 0 | 1 | 0 | 1 |

*if present
+Modes 2c and 2d
++Mode 2d

Table 1 illustrates the switch (S1-S7) states for the seven states described above, with a "0" representing an open switch and a "1" representing a closed switch. Note that the switch network and controller do not need to implement all states 1 to 7, if only a subset of the described modes will be used in a particular implementation.

Again, these four example sequences and seven or eight different states of the switch network are not the only possibilities for the controlling sequence. Again, a number of different sequence implementations are possible and some of these states may be used less frequently than others, depending on load.

Figure 16:
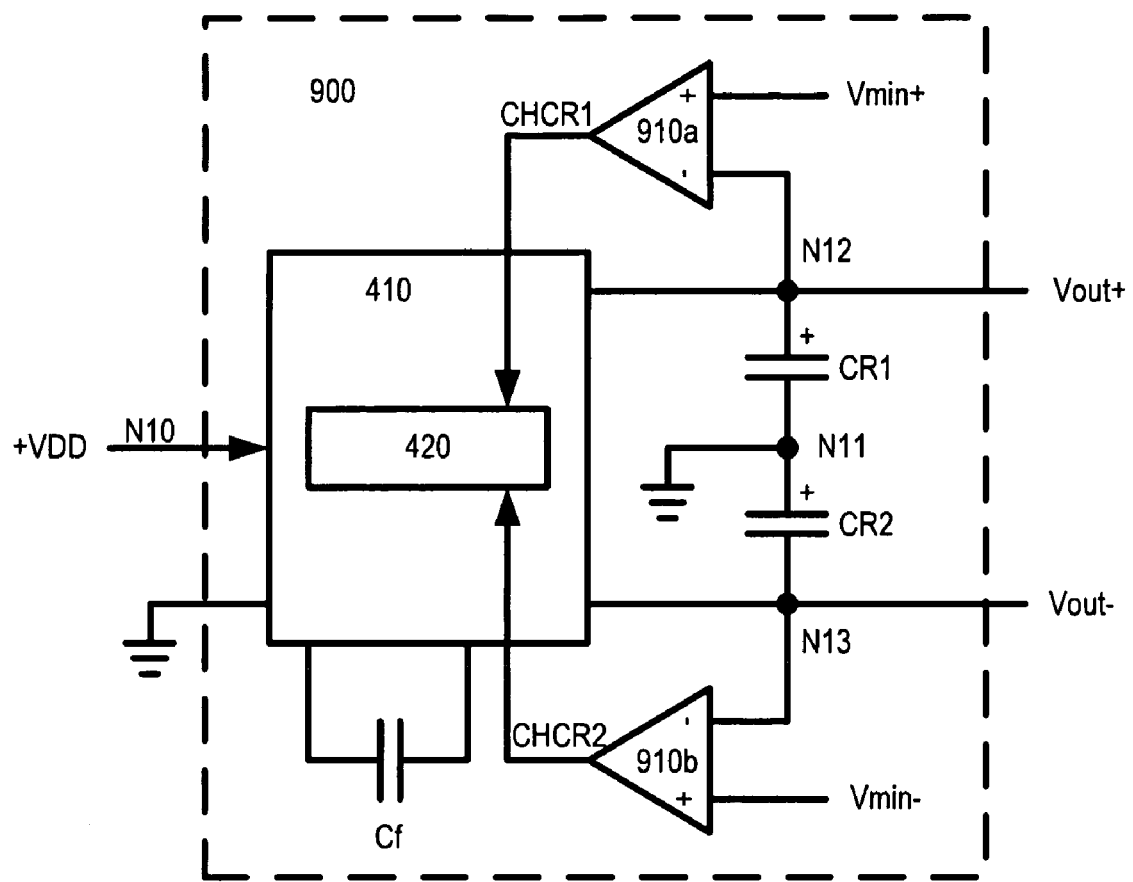
FIG. 16 shows a variation on the circuit of FIG. 4, operable in a closed loop configuration.

FIG. 16 illustrates a similar DMCP 900 circuit as illustrated in FIG. 4 except that the DMCP 900 also includes two comparators 910a, 910b for regulating the two output voltages.

It should be noted that DMCP 900 represents a closed-loop DMCP. Each of the comparators 910a, 910b compares their respective charge pump output voltages (Vout+, Vout−) with a respective threshold voltage (Vmin+, Vmin−) and outputs a respective charge signal CHCR1 and CHCR2. These charge signals CHCR1, CHCR2 are fed into the switch control module 1420 to control the switch array 1410 causing the DMCP to operate charging either the relevant reservoir capacitor. If either output voltage droops past its respective threshold, the charge pump is enabled; otherwise the charge pump is temporarily stopped. This reduces the power consumed in switching the switches, especially in conditions of light load.

This scheme allows output voltages up to +/−VDD/2. It should be further noted that in this configuration, the DMCP 900 may be used to generate higher voltages, but with a drop in efficiency. In this case, the reference voltages (Vmin+/Vmin−) can be adjusted to adjust the output voltages accordingly. The flying capacitor Cf is charged up to +VDD (via switches S1 and S5) and then connected in parallel across either reservoir capacitor CR1 (via switches S2, S5) or CR2 (via switches S3, S6) to raise their voltages to the levels set by the reference voltages. Such an operation increases the ripple voltages on the reservoir capacitors CR1, CR2 but it also reduces switching losses. However, by scaling the reservoir capacitors CR1, CR2 relative to the charging capacitor Cf, the ripple voltages can be reduced.

Figure 17A:
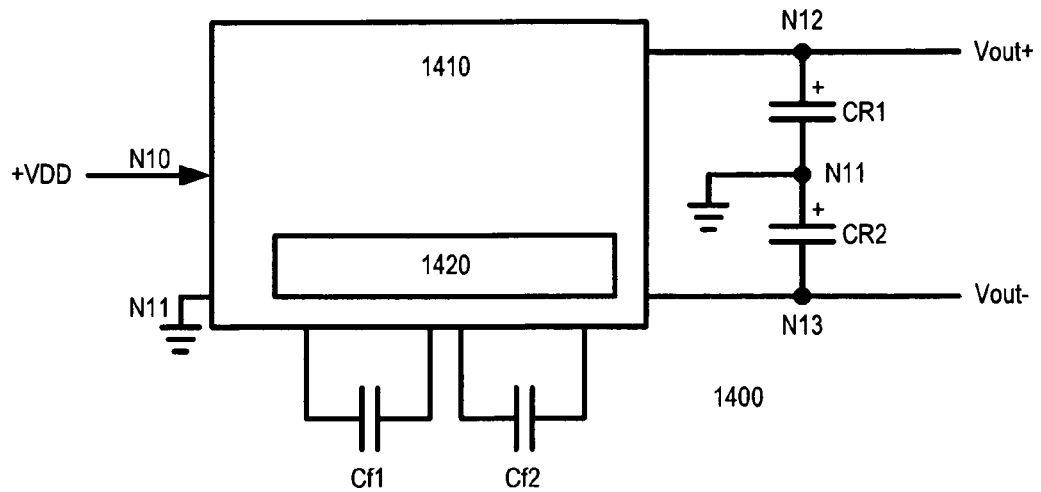
FIG. 17a shows a Dual Mode Charge Pump circuit according to a second main embodiment of the invention.

FIG. 17a is a block diagram of a second main embodiment of the Dual Mode Charge-Pump 1400. As with the previous embodiment there are two reservoir capacitors CR1 and CR2, a switch array 1410 controlled by a switch control module 1420 (which may be software or hardware implemented) However, there are now two flying capacitors Cf1 and Cf2. DMCP 1400 again operates to produce outputs of +/−VDD/2 in a first mode and +/−VDD in a second mode. While this embodiment uses an extra flying capacitor, it has the advantage over the DMCP 400 with a single flying capacitor in that the output voltages Vout+/−now have improved cross-regulation characteristics.

Figure 17B:
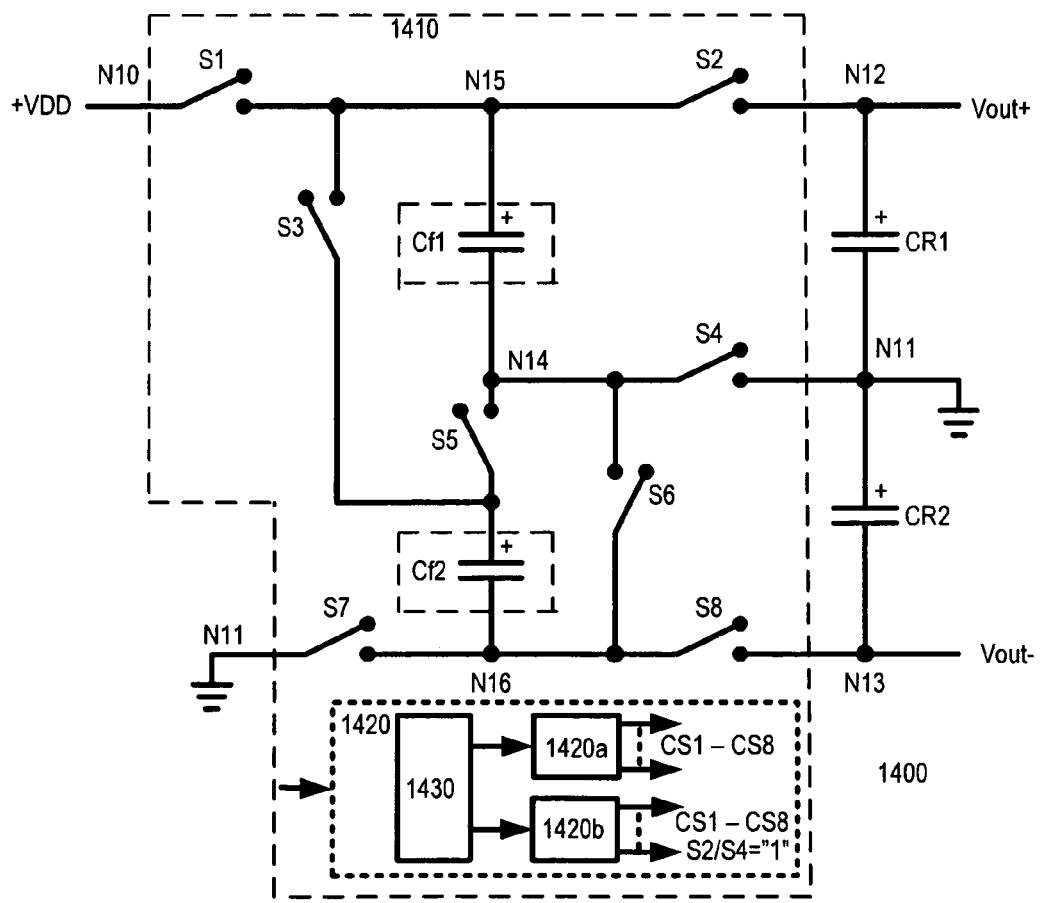
FIG. 17b shows the same circuit as FIG. 14a with detail of the switch array shown.

FIG. 17b shows a more detailed version of the circuit 1400 and, in particular, detail of the switch array 1410 is shown. The switch array 1410 comprises eight switches S1-S8 each controlled by corresponding control signal CS1-CS8 from the switch control module 1420. The switches are arranged such that first switch S1 is connected between the positive plate of the first flying capacitor Cf1 and the input voltage source, the second switch S2 between the positive plate of the first flying capacitor Cf1 and first output node N12, the third switch S3 between the positive plate of the flying capacitor and the positive plate of the second flying capacitor Cf2, the fourth switch S4 between the negative plate of the first flying capacitor Cf1 and common terminal N11, the fifth switch S5 between the negative plate of the first flying capacitor Cf1 and the positive plate of the second flying capacitor Cf2, the sixth switch S6 between the negative plate of the first flying capacitor Cf1 and the negative plate of the second flying capacitor Cf2, the seventh switch between the negative plate of the second flying capacitor Cf2 and common terminal N11 and an eighth switch between the negative plate of the second flying capacitor Cf2 and second output terminal N13. It should be noted that the switches can be implemented in a number of different ways (for example, MOS transistor switches or MOS transmission gate switches) depending upon, for example, an integrated circuit's process technology or the input and output voltage requirements. Also shown in greater detail is the control module 1420 which comprises a mode select circuit 1430 for deciding which controller 1420a, 1420b or control program to use, thus determining which mode the DMCP operates in. Alternatively, the mode select circuit 1430 and the controllers 1420a, 1420b can be implemented in a single circuit block (not illustrated).

The DMCP 1400, in one operational embodiment of its first mode, has three basic states of operation as shown below.

Figure 18A:
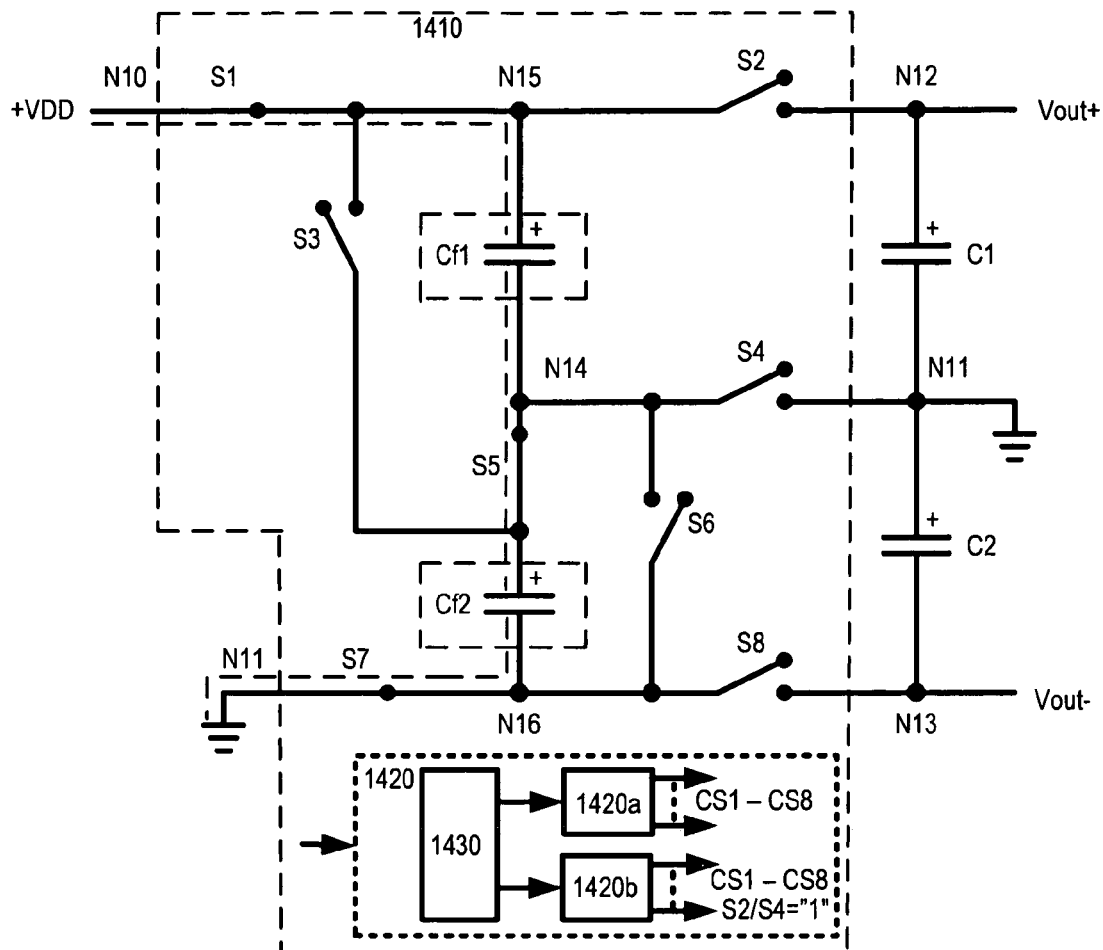
FIGS. 18a and 18b show, respectively, the circuit of FIG. 14 operating in Mode 1, state 1 and an equivalent circuit of this state.
Figure 18B:
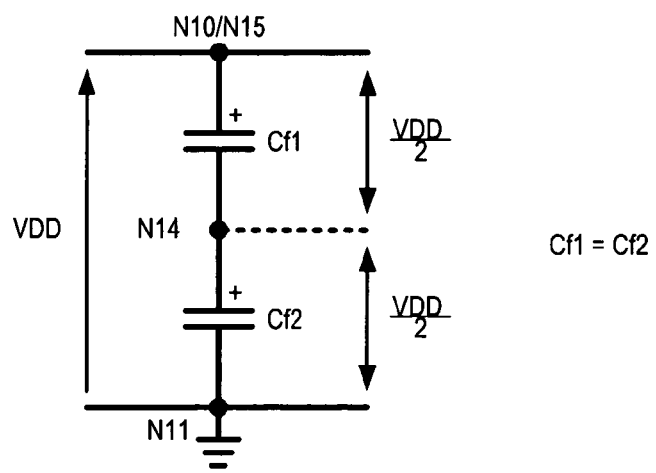

FIGS. 18a and 18b show the switch array 1410 operating in a first state, "state 1". Referring to FIG. 18a, switches S1, S5 and S7 are closed such that capacitors Cf1 and Cf2 are connected in series with each other and in parallel with the input voltage +VDD (N10 & N11). Therefore, capacitors Cf1 and Cf2 share the input voltage +VDD that is applied across them. FIG. 18b shows an equivalent circuit for this state 1 operation with voltage +VDD effectively applied across nodes N10 & N11.

It is preferable, for applications that require symmetrical, but opposite polarity, output voltages, that the values of capacitors Cf1 and Cf2 are of equal such that each capacitor changes voltage by an equal increment when connected in series across a voltage source. If both capacitors are initially discharged, or indeed previously charged to any equal voltages, they will end up each with a voltage equal to half the applied voltage source, in this case one half of the input voltage VDD.

Figure 19A:
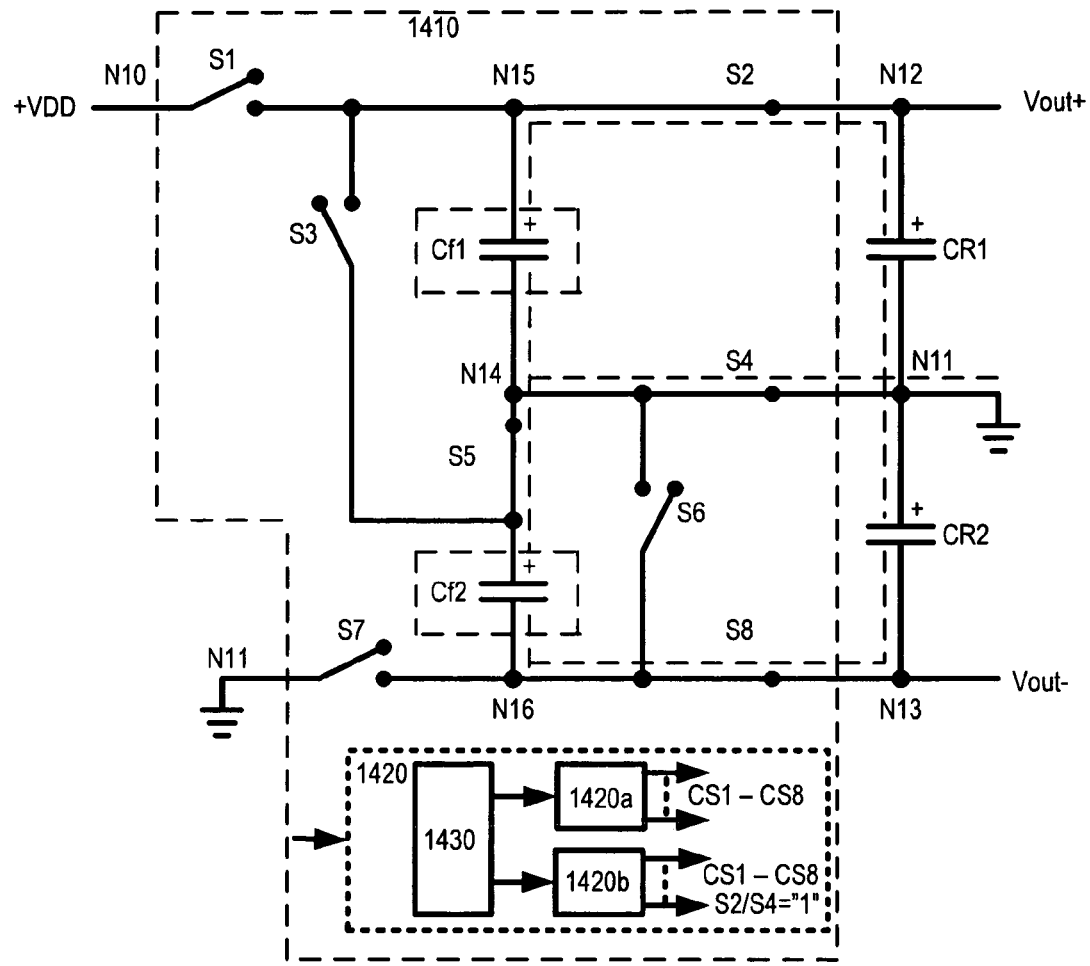
FIGS. 19a and 19b show, respectively, the circuit of FIG. 14 operating in Mode 1, state 2 and an equivalent circuit of this state.
Figure 19B:
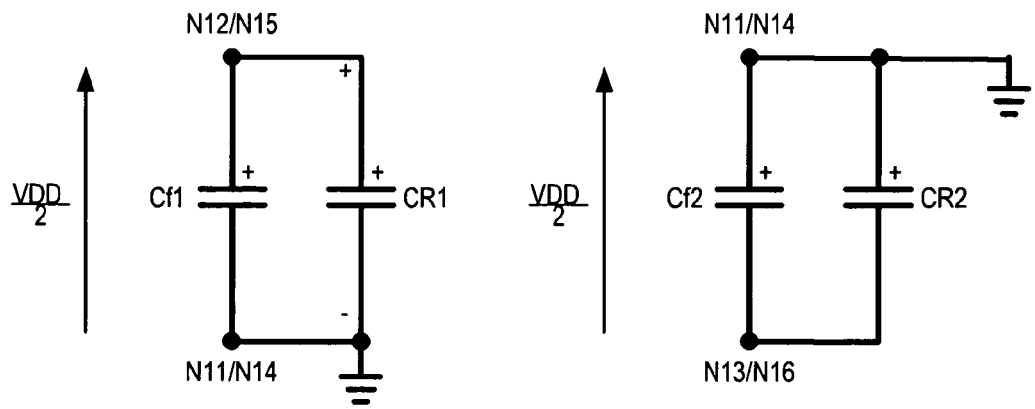

FIGS. 19a and 19b show the switch array 1410 operating in a second state, "state 2" Referring to FIG. 19a, switches S2, S4, S5 and S8 are closed such that capacitors Cf1 and CR1 and Cf2 and CR2 are respectively connected in parallel with each other. Therefore, the voltage across capacitor Cf1 equalises with that across capacitor CR1 such that the voltages across capacitors Cf1, CR1 equalise. Over a plurality of state sequences, the voltages across capacitors Cf1, CR1 will converge to a voltage VDD/2. Similarly, the voltages across capacitors Cf2 and CR2 will also equalise and eventually converge to VDD/2. FIG. 19b shows equivalent circuits for this state 2 operation.

It should be noted that the value of reservoir capacitors CR1 and CR2 do not necessarily need to be the same as that of flying capacitors Cf1 and Cf2. If capacitor CR1 and/or CR2 is much larger than capacitor Cf1 and/or Cf2, they will require more state sequences to charge up to, or close to, VDD/2. The value of reservoir capacitors CR1, CR2 should be chosen depending upon expected load conditions and required operating frequency and output ripple tolerance.

As with all the charge pumps 100, 400, 900 described above, the presence of a significant load on the charge pump output terminals will result in a voltage droop in Vout+, Vout− away from +/−VDD/2. If the load is symmetric, that is there is equal current magnitude on both Vout+ and Vout−, then the symmetry of the system will result in both outputs drooping by the same amount.

However, if for example there is a significant load on Vout+ but no load or a light load on Vout−, then the voltage across capacitor CR1 will reduce, while that across CR2 will remain the same, or substantially the same. This will result in a reduction in the voltage across Cf1 during state 2. As a result of this there will be a larger voltage across capacitor Cf2 at the end of state 1, which will then be applied to CR2 in state 2, while at the same time, capacitor Cf1 will again be connected in series with capacitor CR1, but still having a smaller voltage across it, even initially. Therefore, the output voltages Vout+ and Vout− will both tend to droop negatively, that is to say, the common mode is not controlled.

To avoid this effect, a third state of operation is introduced.

Figure 20A:
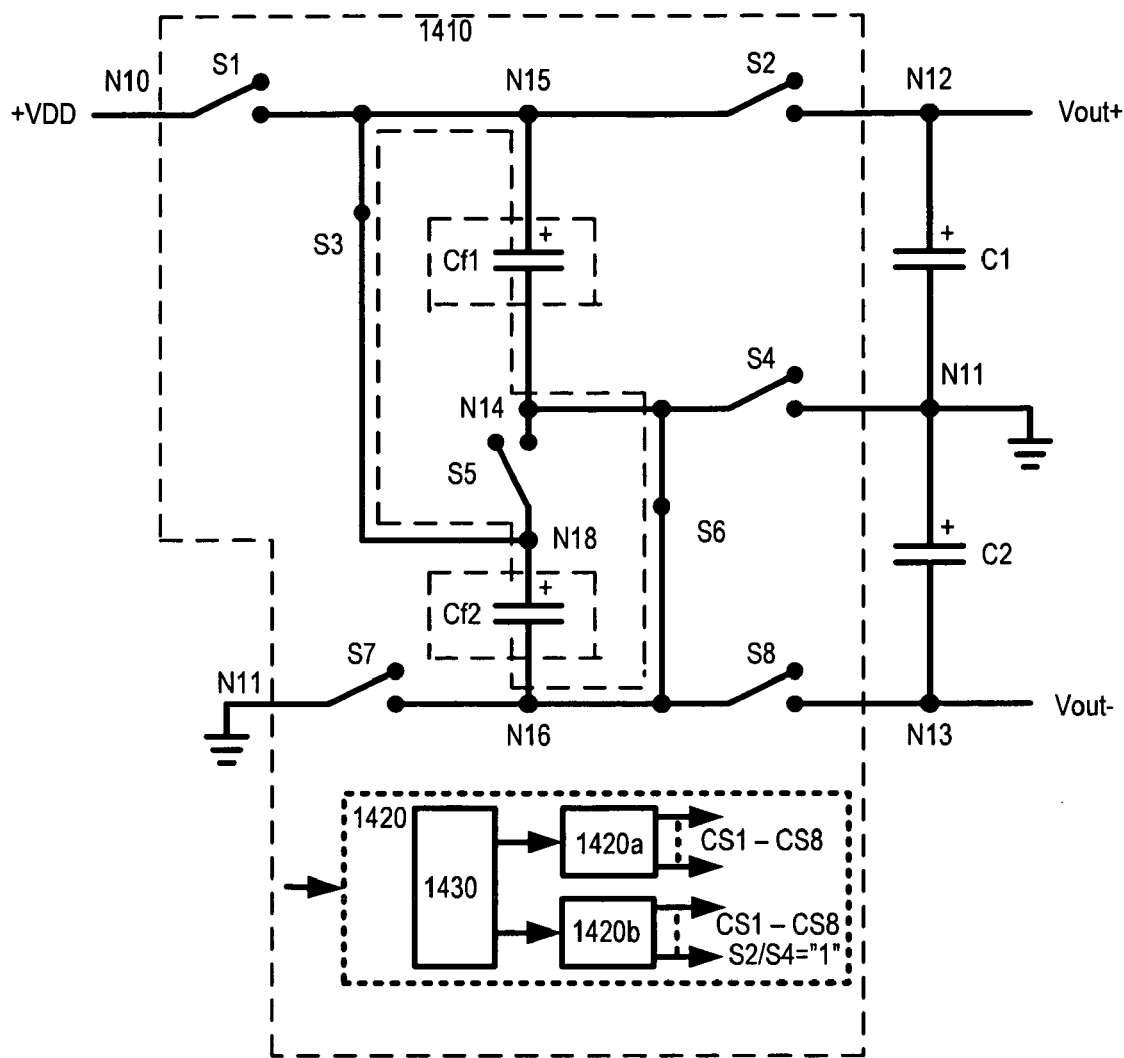
FIGS. 20a and 20b show, respectively, the circuit of FIG. 14 operating in Mode 1, state 3 and an equivalent circuit of this state.
Figure 20B:
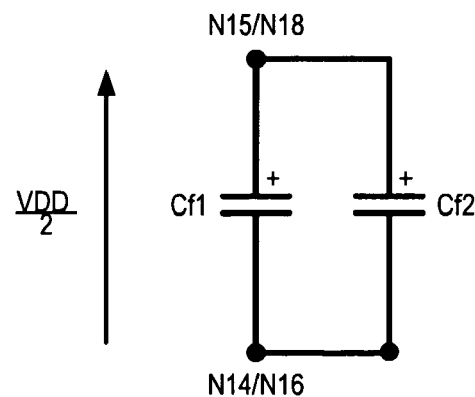

FIGS. 20a and 20b show the switch array 1410 operating in this third state, "state 3". Referring to FIG. 20a, switches S3 and S6 are closed such that the two flying capacitors Cf1 and Cf2 are connected in parallel with each other. Both capacitors Cf1 and Cf2 become charged up to an equal voltage, despite any difference between of their previous voltages. In steady state this becomes approximately VDD/2. FIG. 20b shows an equivalent circuit for the state 3 operation.

As mentioned in the previous embodiment, in states 2 and 3, the voltages across the various capacitors that are connected in parallel may not actually completely equalise in practice, particularly if the switching frequency is high relative to the DMCP's R-C time constant. Therefore, the same considerations as in the previous embodiment must be taken into account when considering capacitor sizes so that any reduction in the output voltage remains within acceptable bounds.

It should be appreciated that the open-loop sequencing of the above three states does not necessarily need to be observed. For example the state sequences could be: 1, 2, 3, 1, 2, 3 . . . (as described above); or 1, 3, 2, 1, 3, 2 . . . ; or 1, 2, 1, 3, 1, 2, 1, 3. It should also be apparent that it is not necessary that state 3 be used as often as the other two states, 1 and 2, for instance a sequence of 1, 2, 1, 2, 1, 2, 3, 1 . . . can be envisaged. It may even be envisaged to dispense with state 3 altogether albeit only in the case of well-balanced loads, or with alternative schemes for common-mode stabilisation.

Other switching and sequencing scenarios exist. For example, in one alternative operational embodiment: State 1 could be replaced by another state, "state 4" whereby switches S1 and S4 are closed (all other switches are open) or a fifth state, "state 5" where S1, S3 and S7 are closed. In these states either capacitor Cf1 or Cf2 charges up to input voltage +VDD. A sixth state, "state 6", with S2 and S8 closed (all other switches open) or a seventh state, "state 7", with switches, or S2, S3 or S8 closed would then operate such that the charged flying capacitor Cf1 or Cf2 is connected across reservoir capacitors CR1 and CR2 (which, in this scenario, may be equal in capacitance). It should be noted that this particular example of an alternative switching and sequencing scenario has the drawback that there is no common mode control and therefore such a switching and sequencing scenario would suffer from common mode drift. However, this common mode drift can be "reset" by altering the switching sequence at appropriate intervals during the "normal" switching and sequencing cycle. These alterations can be predetermined, or initiated in response to observed conditions.

Figure 21:
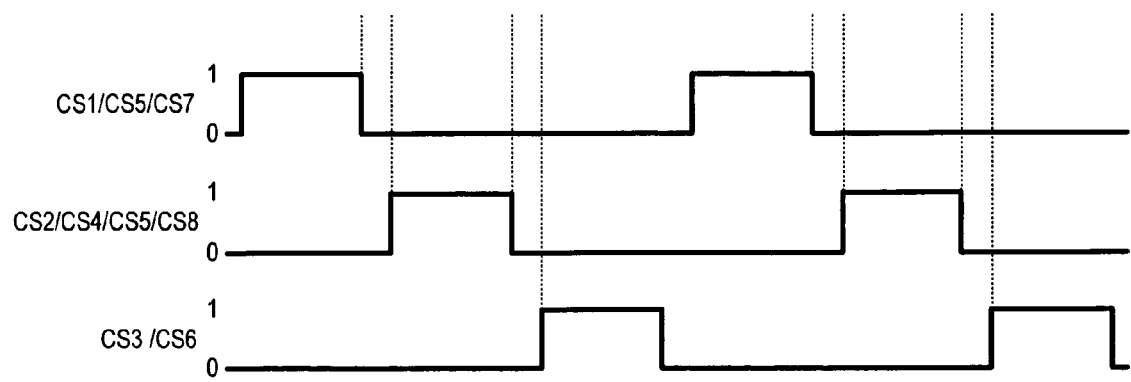
FIG. 21 is a timing diagram showing three switch control signals for the circuit of FIG. 17 operating according to an operative embodiment of the invention in Mode 1.

FIG. 21 illustrates the non-overlapping control signals (CS1-CS8) for controlling the switches (S1-S8) during the three states (1, 2 and 3) of the main operational Mode 1 embodiment of this second main embodiment of the DMCP. As discussed above, this represents only one example out of many possibilities for the controlling sequence.

As before, this second main embodiment of the DMCP is operable in a second mode to obtain output signals at levels +/−VDD. When operating in Mode 2 this DMCP 1400 has two basic states of operation. In both cases switches S2 and S4 are permanently closed.

Figure 22A:
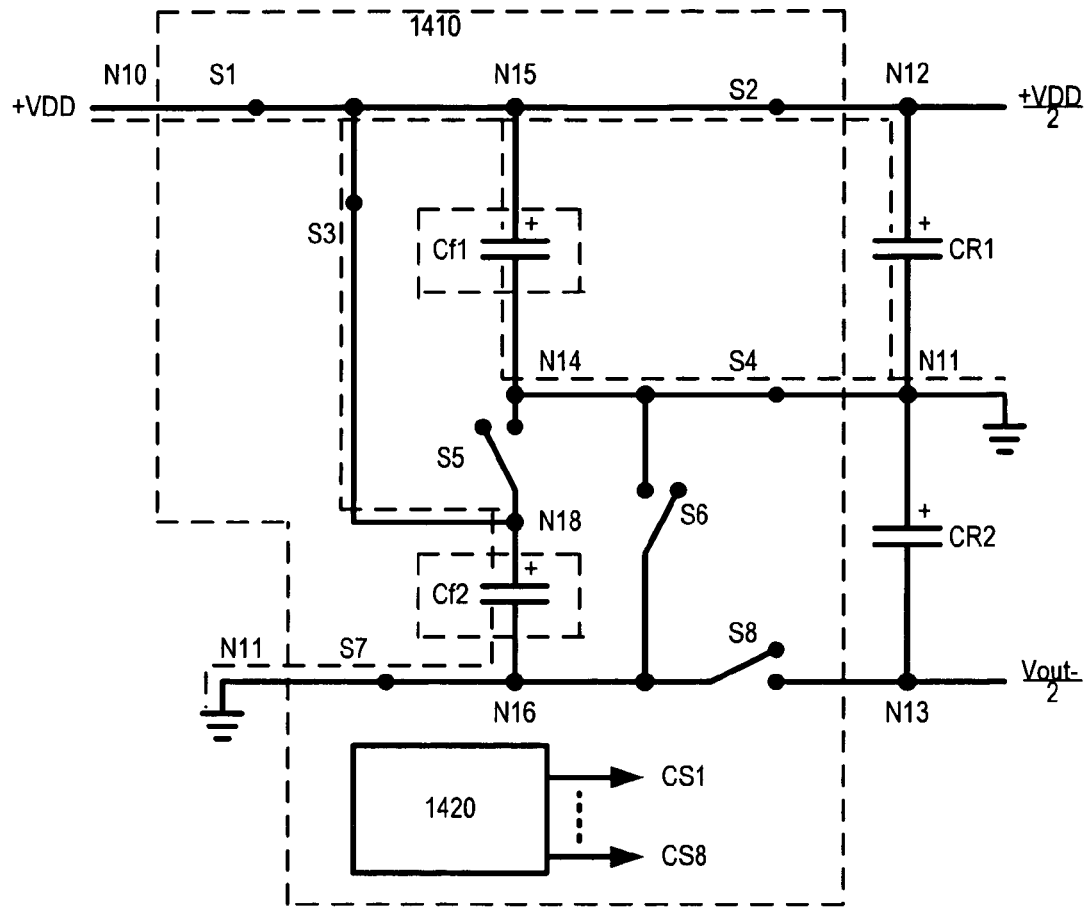
FIGS. 22a and 22b show, respectively, the circuit of FIG. 17 operating in Mode 2, state 8 and an equivalent circuit of this state.

FIG. 22a shows the first of these states "state 8", in which, switches S1, S3 and S7 are closed, as well as the permanently closed S2 and S4. This results in capacitors Cf1, Cf2 and CR1 being connected in parallel across the input voltage +VDD, between nodes N10 & N11 (Cf1 and CR1 are permanently connected in parallel in this mode). Therefore, the three capacitors Cf1, Cf2, CR1 are allowed to charge up to +VDD. FIG. 19b shows an equivalent circuit for this state 8 operation.

Figure 23A:
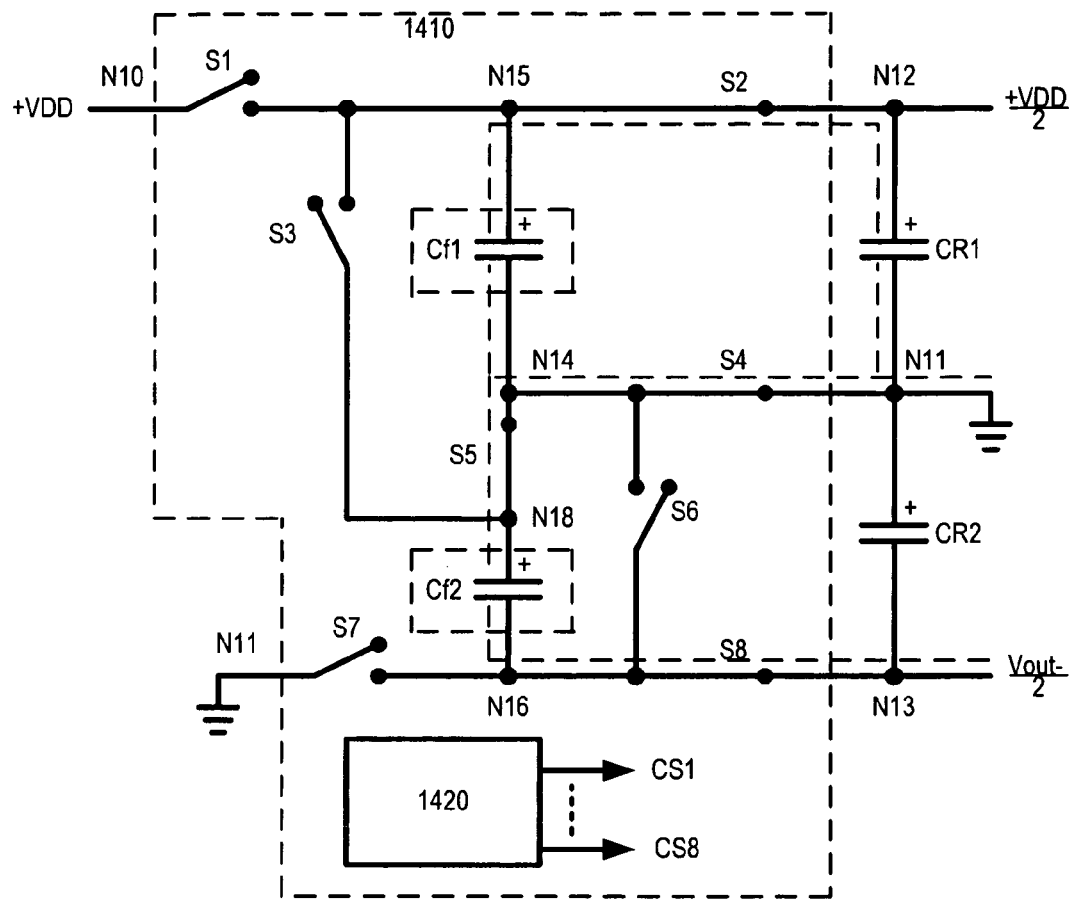
FIGS. 23a and 23b show, respectively, the circuit of FIG. 17 operating in Mode 2, state 2 and an equivalent circuit of this state.
Figure 23B:
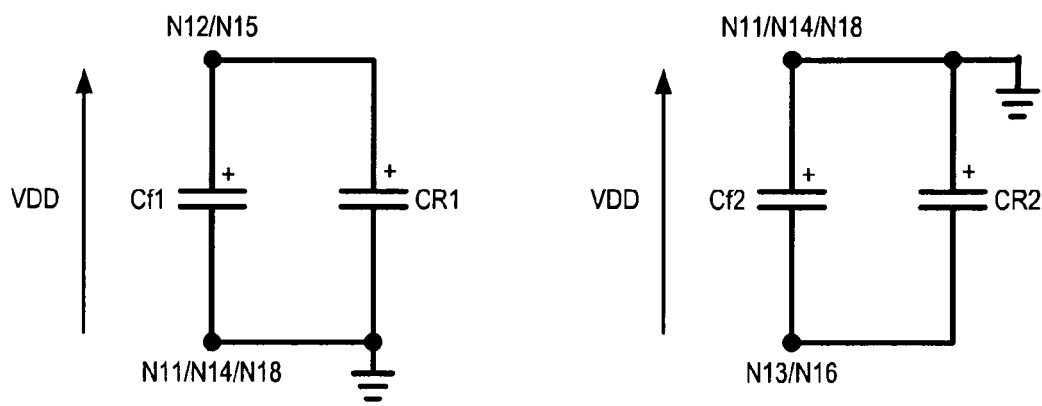

FIG. 23a shows a circuit diagram for the second of these states, "state 2", which is also the second state of mode 1 operation. It can be seen that switches S2, S4, S5 and S8 are closed. FIG. 20b shows an equivalent circuit for this state 2 operation. This state 2 is described in detail above. However in this case each flying capacitor Cf1, Cf2 is charged up to +VDD after state 8, and therefore when the voltages across capacitors CR1 and CR2 equalise with their respective flying capacitor Cf1, Cf2, outputs Vout and Vout− will sit at VDD and VDD− respectively.

Figure 24:
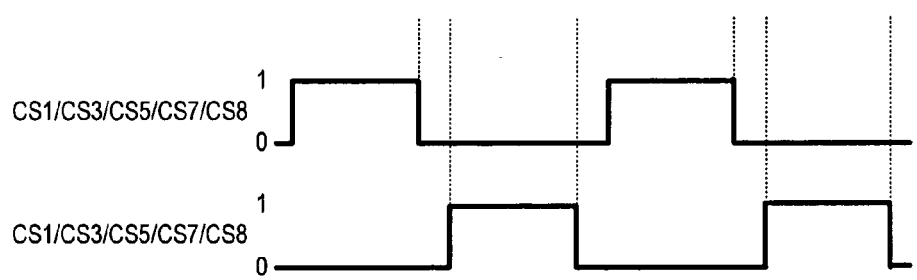
FIG. 24 is a timing diagram showing two switch control signals for the circuit of FIG. 17 operating according to an operative embodiment of the invention in Mode 2.

FIG. 24 illustrates the non-overlapping control signals (CS1-CS8) for controlling the switches (S1-S8) during Mode 2 of this second main embodiment of the DMCP 1400. Again, this represents only one example out of many possibilities for the controlling sequence.

TABLE 2

|  | S1 | S2 | S3 | S4 | S5 | S6 | S7 | S8 |
|---|---|---|---|---|---|---|---|---|
| State 1 | 1 | 0 | 0 | 0 | 1 | 0 | 1 | 0 |
| State 2 | 0 | 1 | 0 | 1 | 1 | 0 | 0 | 1 |
| State 3 | 0 | 0 | 1 | 0 | 0 | 1 | 0 | 0 |
| State 4 | 1 | 0 | 0 | 1 | 0 | 0 | 0 | 0 |
| State 5 | 1 | 0 | 1 | 0 | 0 | 0 | 1 | 0 |
| State 6 | 0 | 1 | 0 | 0 | 0 | 0 | 0 | 1 |
| State 7 | 0 | 1 | 1 | 0 | 0 | 0 | 0 | 1 |
| State 8 | 1 | 1 | 1 | 1 | 0 | 0 | 1 | 0 |

Table 2 illustrates the switch (S1-S8) states for the eight states that this second main embodiment of the DMCP 1400 can operate in, with a "0" representing an open switch and a "1" representing a closed switch. States 1, 2 and 3 are used in the main operational embodiment of this DMCP 1410 in Mode 1, while the states 4, 5, 6 and 7 are used in an alternative operational embodiment of same basic mode. States 2 and 8 are used Mode 2 of this DMCP 1410. It follows that the switch network and controller do not need to implement all states 1 to 8, if only a subset of the described modes will be used in a particular implementation.

Figure 25:
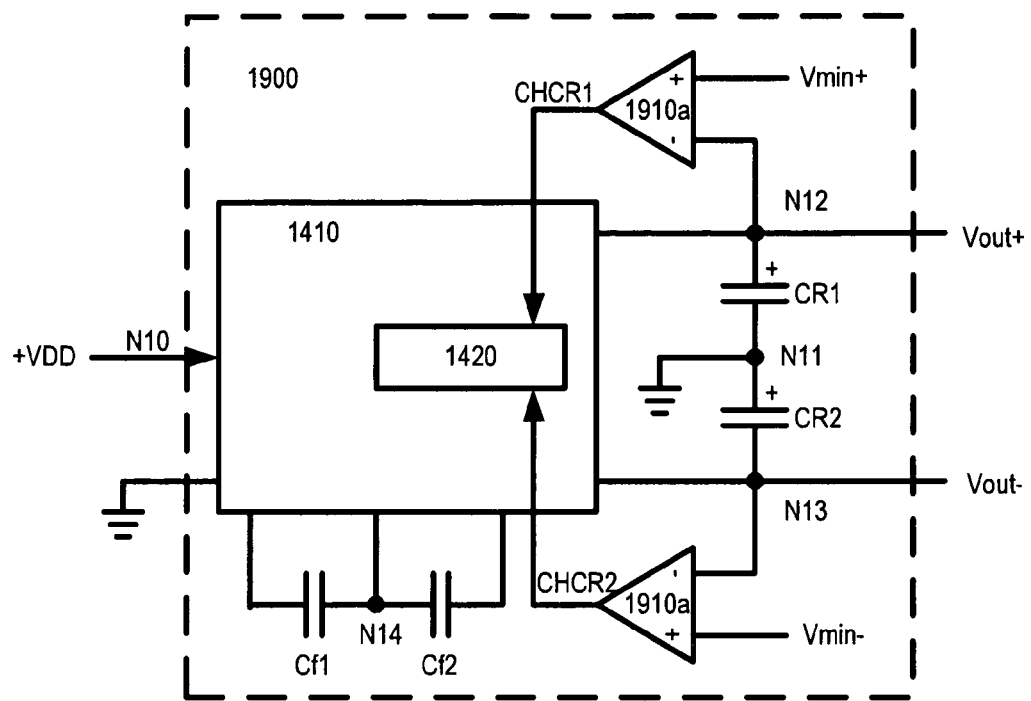
FIG. 25 shows a variation on the circuit of FIG. 17, operable in a closed loop configuration.

FIG. 25 illustrates a closed loop equivalent 1900 of this second main embodiment of the DMCP 1400 circuit, similar to DMCP 900. Again it is largely similar to the open loop DMCP 1400 but further includes two comparators 1910a, 1910b for regulating the two output voltages.

Each of the comparators 1910a, 1910b compares their respective charge pump output voltages (Vout+, Vout−) with a threshold voltage (Vmin+, Vmin−) and each respective comparator 1910a, 1910b outputs a respective charge signal CHCR1, CHCR2. These charge signals CHCR1, CHCR2 are fed into the switch control module 1420 to control the switch array 1410 causing the DMCP to operate charging either the relevant reservoir capacitor. If either output voltage droops past its respective threshold, the charge pump is enabled; otherwise the charge pump is temporarily stopped. This reduces the power consumed in switching the switches, especially in conditions of light load. It is apparent that, as both reservoir capacitors CR1, CR2 are charged in a single state (state 2), that there need only be a single charge signal CHCR which causes the DMCP to charge both reservoir capacitors CR1, CR2.

Figure 22B:
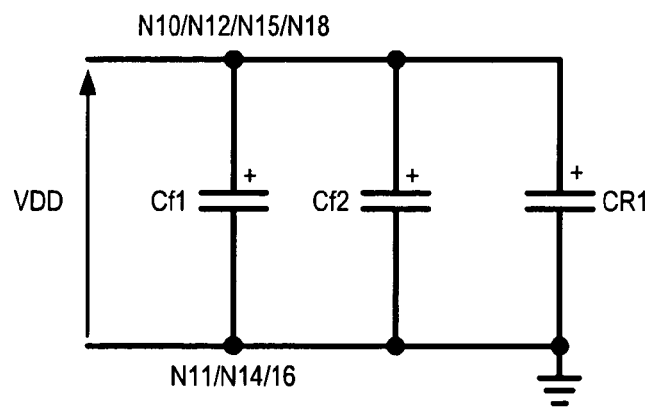

It should be further noted that in this FIG. 22 configuration, the charge pump 1400 may be used to generate any required voltages, but with a drop in efficiency. In this case, the reference voltages (Vmin+/Vmin−) can be adjusted to adjust the output voltages accordingly. The flying capacitors Cf1, Cf2 are charged up to +VDD and then each is connected in parallel across one of the reservoir capacitors CR1 or CR2 to raise their voltages to the levels set by the reference voltages. Such an operation increases the ripple voltages on the reservoir capacitors CR1, CR2 but it also reduces switching losses. However, by scaling the reservoir capacitors CR1, CR2 relative to the flying capacitors Cf1, Cf2, the ripple voltages can be reduced.

Figure 26:
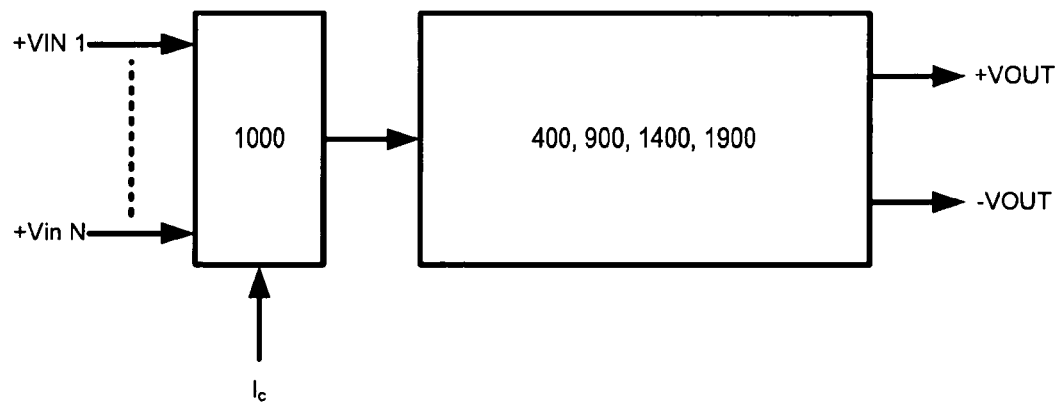
FIG. 26 shows a further embodiment of the invention wherein one of a number of different input voltage values may be selected as an input voltage to any of the Dual Mode Charge Pumps disclosed herein.

FIG. 26 illustrates a further embodiment of any of the novel Dual Mode Charge Pumps 400, 900 1400, 1900 described above, wherein one of a number of different input voltage values may be selected as an input voltage to the DMCP 400, 900 1400, 1900. It shows an input selector 1000 having a number of different voltage inputs (+Vin 1 to +Vin N), the actual input chosen being determined by control input Ic. The chosen voltage level then serves as the input voltage VDD for the Dual Mode Charge Pump 400, 900, 1400, 1900.

From the above description, referring also to FIGS. 2a and 2b, it will be understood how these DMCP circuits can be applied in portable audio and other apparatus to provide adaptability to different modes of use, without the same sacrifices of quality/cost/battery life and so forth that are problematic in the state of the art.

Many other modifications are possible in the control scheme, the form of the controller and even specifics of the switch network. The skilled reader will appreciate that the above and other modifications and additions are possible to these circuits, without departing from the spirit and scope of the invention as defined in the appended claims. Accordingly, the above described embodiments are presented to illustrate rather than limit the scope of the invention. For interpreting this specification and claims, the reader should note that the word "comprising" does not exclude the presence of elements or steps other than those listed in a claim, the singular article "a" or "an" does not exclude a plurality, and a single element may fulfil the functions of several elements recited in the claims. Any reference signs in the claims shall not be construed so as to limit their scope.

Where a claim recites that elements are "connected" or are "for connecting", this is not to be interpreted as requiring direct connection to the exclusion of any other element, but rather connection sufficient to enable those elements to function as described. The skilled reader will appreciate that a good, practical design might include many auxiliary components not mentioned here, performing, for example, start-up and shutdown functions, sensing functions, fault protection or the like, some of which have been mentioned already, and none of which detract from the basic functions characteristic of the invention in its various embodiments described above in the claims.

What is claimed is:

1. An audio amplifier circuit for amplifying an input signal to produce an output signal for driving a load, wherein said circuit is configured to operate:
   in a first mode when directly driving an audio output transducer and
   in a second mode when driving a line input of an external amplifying apparatus, wherein the output signal produced in the second mode has a higher voltage amplitude for a given signal content than the output signal produced in the first mode;
   wherein the circuit comprises common output stage circuitry for use in both modes, and a dual mode power supply circuit for supplying said output stage in the first mode with a lower supply voltage than in the second mode.

2. An apparatus as claimed in claim 1 wherein the supply voltage in the first mode is approximately half that in the second mode.

3. An apparatus as claimed in claim 1 wherein the supply voltage in the second mode spans a voltage in the range 4 to 7 volts.

4. An apparatus as claimed in claim 1 wherein the supply voltage in the first mode is split either side of a ground reference.

5. An apparatus as claimed in 4 wherein the supply voltage in the second mode is also split either side of said ground reference.

6. An apparatus as claimed in claim 1 wherein, in use, the power output of said audio amplifier circuit resultant from a full scale signal driving said audio output transducer in said first mode is in the order of milliwatts or tens of milliwatts RMS.

7. An apparatus as claimed in claim 1 wherein the signal for the external load can be delivered to an output jack which is the same jack as used for the audio output transducer.

8. An apparatus as claimed in claim 1 wherein a dedicated output terminal is provided for line level signals.

9. An apparatus as claimed in claim 1 further comprising means for limiting the output current of said amplifier circuit when operating in said second mode, such that maximum power output in said second mode is less than that in the first mode, in spite of the higher maximum voltage amplitude.

10. An apparatus as claimed in claim 1, the apparatus including said audio output transducer, said transducer having an impedance in the range 7 to 90 ohms.

11. An apparatus as claimed in claim 10 wherein said audio output transducer is a headphone device.

12. An apparatus as claimed in claim 10 wherein said audio output transducer is a loudspeaker built into the portable audio apparatus.

13. An apparatus as claimed in claim 1 wherein said dual mode power supply circuit includes a dual mode charge pump circuit operable in, at least, said first mode to divide an input supply voltage to provide a dual polarity supply to said output stage, the dual polarity supply spanning in total only the same or less than the input supply voltage, and in said second mode to provide a dual polarity supply to said output stage which spans greater than the input supply voltage.

14. An apparatus as claimed in claim 13 wherein the charge-pump circuit comprises:
an input terminal and a common terminal for connection to an input voltage,
first and second output terminals for outputting a plurality of output voltages, said first and second output terminals being, in use, connected to said common terminal via respective first and second loads and also via respective first and second reservoir capacitors,
at least first and second flying capacitor terminals for connection to at least one flying capacitor,
a network of switches that is operable in a plurality of different states for interconnecting said terminals, and
a controller for operating said network of switches in a sequence of said different states,
wherein said controller is operable in first and second modes, and where, in the first of said modes, said sequence is adapted repeatedly to transfer packets of charge from said input terminal to said reservoir capacitors via said flying capacitor depending on the state, thereby generating positive and negative output voltages together spanning a voltage approximately equal to the input voltage, and centered on the voltage at the common terminal and in the second of said modes generates positive and negative output voltages each up to substantially said input voltage.

15. An apparatus as claimed in claim 14 wherein said controller is adapted in the first mode to operate said switches in a sequence which interleaves repetitions of at least first and second states, the first state being effective to divide said input voltage between the flying capacitor and first reservoir capacitor in series, the second state being effective to apply the flying capacitor's portion of said divided voltage across the second reservoir capacitor.

16. An apparatus as claimed in claim 15 wherein said controller is adapted in the first mode to include in said sequence repetitions a third state, the third state being effective to apply the flying capacitor's portion of said divided voltage across the first reservoir capacitor.

17. An apparatus as claimed in claim 15 wherein said controller is adapted in the second mode to operate said switches in a sequence which interleaves repetitions of at least second and sixth states, the sixth state being effective to charge the flying capacitor and said first reservoir capacitor substantially to said input voltage, the second state being effective to transfer said voltage from the flying capacitor to the second reservoir capacitor.

18. An apparatus as claimed in claim 17 wherein said controller is adapted in the second mode to include in said sequence repetitions a seventh state, said seventh state being effective to charge the flying capacitor independent of either reservoir capacitor.

19. An apparatus as claimed in claim 17 wherein said network includes a switch which is used in the second mode to connect the input terminal to the first output terminal independently of said first flying capacitor terminal.

20. An apparatus as claimed in claim 19 operable such that said switch is always closed when said circuit is operating in a particular implementation of said second mode, thus ensuring that said first reservoir capacitor is always connected between said input terminal and said common terminal when operating in this particular implementation.

21. An apparatus as claimed in claim 14 wherein the controller is adapted to detect automatically the type of load connected and to select the first or second mode of operation automatically.

22. An apparatus as claimed in claim 21 operable such that said detection is made implicitly by reference to a volume setting input of the amplifier.

23. An apparatus as claimed in claim 22 wherein the first mode is selected when said volume is at or near a maximum.

24. Communications apparatus incorporating audio apparatus as claimed in claim 1.

25. A headphone driving apparatus incorporating audio apparatus according to claim 1, and a headphone jack connected to the output stage at least in said first mode.

26. The headphone apparatus as claimed in claim 25 further including a separate output connector for outputting line level signals in said second mode.

27. The headphone apparatus as claimed in claim 25 wherein the amplifier circuit is operable to drive line level signals through said headphone jack in said second mode.

28. An electronic audio amplifier circuit operable in two modes:
a first mode for the direct driving of an audio output transducer and
a second mode to drive a line input of an external amplifying apparatus, an output signal to be provided to said line input in the second mode having a higher voltage amplitude for a given signal content than an output signal driving said audio output transducer;
wherein the circuit comprises:
common output stage circuitry for use in both modes, and
a dual mode power supply circuit for supplying said output stage in the first mode with a lower supply voltage than in the second mode; and
means for limiting the circuit's output current when operating in said second mode, such that maximum power output in said second mode is less than that in the first mode, in spite of the higher maximum voltage amplitude.

29. An audio amplifier circuit for providing an output signal to an audio transducer, said audio amplifier circuit comprising:
a power amplifier having an audio input for receiving an audio input signal, an audio output for providing said output signal, and a pair of power supply rail connections substantially symmetric about a reference potential, forming a bi-polar power supply input; and
a charge pump power supply for providing a bi-polar power supply voltage across said pair of power supply rail connections of said power amplifier, wherein said charge pump power supply has a select input for selecting an operating mode of said power supply, wherein in a first operating mode, said bi-polar power supply voltage is equal to a first voltage, and wherein in a second operating mode said -bi-polar power supply voltage is substantially equal to a rational fraction of said first voltage-, wherein in both of the first operating mode and the second operating mode, the bipolar power supply voltage is substantially symmetric about the reference potential
wherein said charge pump power supply comprises first and second reservoir capacitors, each coupled between a respective one of said power supply rail connections and said reference potential and only a single flying capacitor.

30. The audio amplifier circuit of claim 29, wherein in said second operating mode said power supply voltage is substantially equal to half of said first voltage.

31. The audio amplifier circuit of claim 29, wherein said charge pump comprises a plurality of capacitors and a switching circuit for switching said capacitors alternatively from a series to a parallel combination, and wherein in response to said select input, a pattern of switching of said switching circuit is altered, whereby a rational relationship between said power supply voltage in said first operating mode and said power supply voltage in second operating mode is provided.

32. The audio amplifier circuit of claim 29, wherein said charge pump power supply includes a switched-capacitor voltage divider that uses a series-coupling of capacitors in a first switching phase of said second operating mode to produce said rational fraction of said first voltage and couples at least one of said capacitors to at least one of said power supply rail connections in a second switching phase of said second operating mode to apply said rational fraction of said first voltage to said at least one power supply rail connection.

33. The audio amplifier circuit if claim 29, further comprising a first amplifier stage circuit having an output coupled to said audio input of said power amplifier, wherein said first amplifier stage has a pair of first stage power supply rail connections connected to a fixed voltage power supply, wherein a fixed voltage of said fixed voltage power supply does not change substantially with selection of said operating mode of said power supply.

34. The audio amplifier circuit of claim 29, further comprising a control circuit for selecting said operating mode in conformity with a volume setting of said audio amplifier circuit.

35. The audio amplifier circuit of claim 29, further comprising a control circuit for providing a selection signal to said select input in conformity with an amplitude of said audio input, whereby clipping of said power amplifier is prevented when said second operating mode of said charge pump power supply is selected by instead selecting said first operating mode.

36. The audio amplifier circuit of claim 35, wherein said control circuit generates an indication of an amplitude of said audio input, and wherein said control circuit provides said selection signal to said select input in conformity with said indication of said amplitude of said audio input, whereby said first operating mode is selected when said indication of amplitude indicates that a higher power level is required from said audio output and said second operating mode is selected when said indication of amplitude indicates that a higher power level is not required from said audio output.

37. The audio amplifier circuit of claim 29, wherein said charge pump power supply comprises:
a first flyback capacitor; and
a first switching circuit for alternatively coupling said first flyback capacitor in said first operating mode between a positive one of said power supply input terminals and a positive one of said pair of power supply rail connections in first phase and between said pair of power supply input terminals in a second phase, and wherein when said charge pump power supply is in said second operating mode, said first switching circuit couples said positive one of said power supply input terminals to said positive one of said pair of power supply rail connections.

* * * * *